US012777703B2

(12) United States Patent
Jo et al.

(10) Patent No.: US 12,777,703 B2
(45) Date of Patent: Oct. 27, 2026

(54) ELECTRONIC DEVICE COMPRISING MIXED MATERIAL LAYER AND ELECTRONIC APPARATUS INCLUDING THE SAME

(71) Applicant: Samsung Electronics Co., Ltd., Suwon-si (KR)

(72) Inventors: Sanghyun Jo, Suwon-si (KR); Hyangsook Lee, Suwon-si (KR); Eunha Lee, Suwon-si (KR); Jinseong Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 384 days.

(21) Appl. No.: 18/531,078

(22) Filed: Dec. 6, 2023

(65) Prior Publication Data

US 2024/0194761 A1 Jun. 13, 2024

(30) Foreign Application Priority Data

Dec. 7, 2022 (KR) ........................ 10-2022-0170045

(51) Int. Cl.

| | |
|---|---|
| ***H10D 64/68*** | (2025.01) |
| ***H10B 51/20*** | (2023.01) |
| ***H10B 53/30*** | (2023.01) |
| ***H10D 30/43*** | (2025.01) |
| ***H10D 30/67*** | (2025.01) |
| ***H10D 30/69*** | (2025.01) |

(52) U.S. Cl.

CPC ........... *H10D 64/689* (2025.01); *H10B 51/20* (2023.02); *H10B 53/30* (2023.02); *H10D 30/6739* (2025.01); *H10D 30/701* (2025.01); *H10D 30/43* (2025.01); *H10D 30/6757* (2025.01)

(58) Field of Classification Search

CPC .. H10D 64/689; H10D 30/701; H10D 64/033; H10D 62/405

See application file for complete search history.

(56) References Cited

U.S. PATENT DOCUMENTS

2017/0365719 A1 12/2017 Chen et al.
2019/0207035 A1 7/2019 Chen et al.
(Continued)

FOREIGN PATENT DOCUMENTS

CN 114023813 A 2/2022
KR 10-2020-0021276 A 2/2020
KR 10-2021-0138993 A 11/2021

OTHER PUBLICATIONS

Ajay K. Yadav et al., "Spatially resolved steady-state negative capacitance", NATURE, vol. 565, Jan. 24, 2019.
(Continued)

*Primary Examiner* — Nduka E Ojeh
(74) *Attorney, Agent, or Firm* — Harness, Dickey & Pierce, P.L.C.

(57) ABSTRACT

Provided as an electronic device and an electronic apparatus including the electronic device. The electronic device includes a conductive material layer, a mixed material layer covering the conductive material layer, and an electrode layer covering the mixed material layer. The mixed material layer includes an orthorhombic crystal phase and a tetragonal crystal phase mixed therein such that a ferroelectric material and an anti-ferroelectric material coexist therein.

19 Claims, 19 Drawing Sheets

(56) References Cited

U.S. PATENT DOCUMENTS

| | | | | |
|---|---|---|---|---|
| 2020/0013784 | A1 | 1/2020 | An et al. | |
| 2020/0055134 | A1* | 2/2020 | Heo | B23K 3/08 |
| 2020/0058658 | A1 | 2/2020 | Heo et al. | |
| 2020/0303385 | A1* | 9/2020 | Heo | G11C 11/223 |
| 2020/0328309 | A1 | 10/2020 | Yin et al. | |
| 2021/0074727 | A1* | 3/2021 | Prasad | H10B 51/10 |
| 2021/0296469 | A1 | 9/2021 | Lai et al. | |
| 2021/0359101 | A1* | 11/2021 | Heo | H10D 64/689 |
| 2022/0059671 | A1 | 2/2022 | Lai et al. | |
| 2022/0359762 | A1* | 11/2022 | Chen | H10D 30/701 |
| 2024/0107776 | A1* | 3/2024 | Lu | G11C 11/223 |

OTHER PUBLICATIONS

Michael Hoffmann et al., "Unveiling the double-well energy landscape in a ferroelectric layer", NATURE, vol. 565, Jan. 24, 2019.

* cited by examiner

ELECTRONIC DEVICE COMPRISING MIXED MATERIAL LAYER AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2022-0170045, filed on Dec. 7, 2022, in the Korean Intellectual Property Office, the disclosure of which is incorporated by reference herein in its entirety.

BACKGROUND

1. Field

The disclosure relates to an electronic device and an electronic apparatus including the same.

2. Description of the Related Art

According to the trend of increasing the integration density of electronic devices such as memories or logic circuits, electronic devices in electronic apparatuses have become more refined. Accordingly, there is an increasing demand for refinement and low power consumption of electronic devices such as transistors and capacitors. However, because the capacitance of an electronic device is proportional to its area, the capacitance may decrease as the size of the electronic device decreases, and a leakage current may increase when the thickness of a dielectric is reduced to increase the capacitance. Accordingly, dielectric materials having a high dielectric constant (high-K) are increasingly used in electronic devices.

Recently, in order to overcome power scaling limitations of related-art devices with high dielectric constants, new low-power devices using negative capacitance characteristics of ferroelectric materials have been proposed. In order to implement such a low-power device, stabilization of the negative capacitance state of a ferroelectric thin film is required.

SUMMARY

Provided is an electronic device having an extended region exhibiting negative capacitance.

Provided is an electronic apparatus including the electronic device.

Additional aspects will be set forth in part in the description which follows and, in part, will be apparent from the description, or may be learned by practice of the presented embodiments of the disclosure.

According to an aspect of at least one embodiment, an electronic device include a conductive material layer, a mixed material layer covering the conductive material layer and comprising a mixture of an orthorhombic crystal phase and a tetragonal crystal phase such that a ferroelectric material and an anti-ferroelectric material coexist in the mixed material layer, wherein a proportion of the orthorhombic crystal phase is between about 35% and about 65% in the mixed material layer, and an electrode layer covering the mixed material layer.

The mixed material layer may include an oxide including $Hf_{1-x}A_xO_2$ ($x \leq 0.5$), and A may include at least one of Al, Si, Zr, Y, La, Gd, and Sr.

The mixed material layer may include $Hf_{1-x}Zr_xO_2$ ($x \leq 0.5$).

The mixed material layer may be a single layer.

The orthorhombic crystal phase may have ferroelectricity, the tetragonal crystal phase may have anti-ferroelectricity, and the mixed material layer may include one to three energy barrier regions.

The mixed material layer may be configured to have two or three S-curves in a polarization-electric field relationship.

The mixed material layer may exhibit negative capacitance within an electric field range of about −10 MV/cm to about +10 MV/cm.

The mixed material layer may be a thickness of about 0.1 nm to about 20 nm.

Crystallization of the mixed material layer may be obtained by performing a heat treatment before forming the electrode layer or by performing a heat treatment before and after the forming of the electrode layer.

The electronic device may further include a dielectric layer between the mixed material layer and at least one of the conductive material layer and the electrode layer.

The electronic device may comprise a transistor, the conductive material layer may include a channel, and the electrode layer may include a gate electrode.

The electronic device may further include a substrate, and the channel may be at least one of spaced apart from an upper surface of the substrate and extends in a first direction, or include a plurality of channel elements spaced apart from each other in a second direction different from the first direction.

The channel may include the plurality of channel elements, and the mixed material layer may include a plurality of mixed material layers surrounding the plurality of channel elements, respectively, and the gate electrode may protrude from the upper surface of the substrate to surround the plurality of mixed material layers.

The electronic device may further include a stack structure including a plurality of the gate electrode alternately stacked in a vertical direction with a plurality of insulating layers, a plurality of channel holes penetrating the stack structure in the vertical direction, and a plurality of memory cell strings in the plurality of channel holes, the plurality of memory cell strings each including the mixed material layer and the conductive material layer concentrically arranged inside the plurality of channel holes, wherein the plurality of memory cell strings are two-dimensionally arranged.

According to an aspect of another embodiment, an electronic apparatus includes at least one electronic device, wherein the at least one electronic device includes a conductive material layer, a mixed material layer covering the conductive material layer and comprising a mixture of an orthorhombic crystal phase and a tetragonal crystal phase such that a ferroelectric material and an anti-ferroelectric material coexist in the mixed material layer, wherein a proportion of the orthorhombic crystal phase is between about 35% and about 65% in the mixed material layer, and an electrode layer covering the mixed material layer.

The mixed material layer may include a single layer including $Hf_{1-x}A_xO_2$($x \leq 0.5$), A may include at least one of Al, Si, Zr, Y, La, Gd, and Sr, and the mixed material layer may include one to three energy barrier regions.

The mixed material layer may be a single layer including $Hf_{1-x}Zr_xO_2$ ($x \leq 0.5$) and may be configured to include one to three energy barrier regions.

The electronic device may comprise a transistor, the conductive material layer may include a channel, the electrode layer may include a gate electrode, the electronic device may further include a substrate, and the channel may be at least one of spaced apart from an upper surface of the substrate and extending in a first direction, or include a plurality of channel elements spaced apart from each other in a second direction different from the first direction.

The channel may comprise the plurality of channel elements, and the mixed material layer may include a plurality of mixed material layers arranged to surround the plurality of channel elements, respectively, and the gate electrode may be arranged to protrude from the upper surface of the substrate to surround the plurality of mixed material layers.

The electronic device may comprise a transistor, the conductive material layer may include a channel, the electrode layer may include a gate electrode. The electronic device may further include a stack structure including a plurality of the gate electrode alternately stacked in a vertical direction with a plurality of insulating layers, a plurality of channel holes penetrating the stack structure in the vertical direction, and a plurality of memory cell strings in the plurality of channel holes, the plurality of memory cell strings each including the mixed material layer and the conductive material layer concentrically arranged inside the plurality of channel holes, wherein the plurality of memory cell strings are two-dimensionally arranged.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
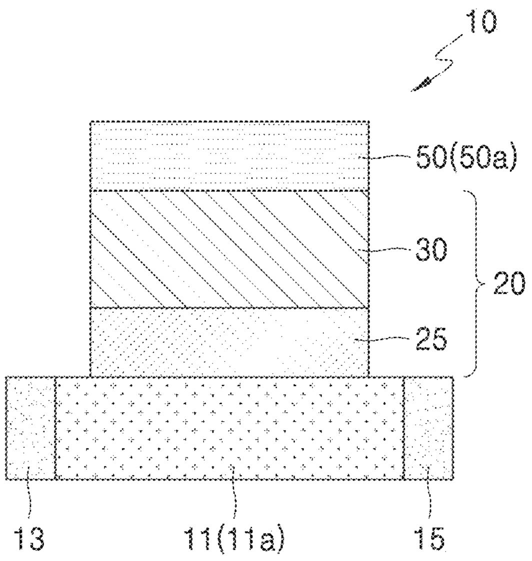
FIGS. 1 to 3 are cross-sectional views schematically illustrating electronic devices according to some embodiments.

Reference will now be made in detail to embodiments, examples of which are illustrated in the accompanying drawings. Hereafter and in the following drawings, like reference numerals refer to like elements, and the sizes of elements in the drawings may be exaggerated for clarity and convenience of description. In this regard, the present embodiments may have different forms and should not be construed as being limited to the descriptions set forth herein. Accordingly, the embodiments are merely described below, by referring to the figures, to explain aspects and the embodiments described below are merely provided as examples, and various modifications are possible from these embodiments. As used herein, the term "and/or" includes any and all combinations of one or more of the associated listed items. Expressions such as "at least one of," when preceding a list of elements, modify the entire list of elements and do not modify the individual elements of the list.

In the following descriptions, when an element is referred to as being "on" or "above" another element, the element may directly contact a top/bottom/left/right portion of the other element, or may be on/under/next to the other element with intervening elements therebetween. Unless otherwise defined specifically, a singular expression may encompass a plural expression. In addition, when an element is referred to as "including" a component, the element may additionally include other components rather than excluding other components as long as there is no particular opposing recitation. Additionally, spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, device may be otherwise oriented, for example, rotated 90 degrees or at other orientations, and the spatially relative descriptors used herein should be interpreted accordingly.

The term "the" and other demonstratives similar thereto may include a singular form and plural forms. Operations of a method described herein may be performed in any suitable order unless otherwise indicated herein or otherwise clearly contradicted by context, and the disclosure is not limited to the described order of the operations.

In addition, as used herein, functional blocks, including those described with terms such as " . . . er (or)", " . . . unit", " . . . module", etc., denote a unit that is configured to perform at least one function or operation, which may be implemented as processing circuitry such as hardware, software, and/or a combination thereof. For example, the processing circuitry more specifically may include (and/or be included in), but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Line connections or connection members between elements depicted in the drawings represent functional connections and/or physical or circuit connections by way of example, and in actual applications, they may be replaced or embodied with various suitable additional functional connections, physical connections, or circuit connections.

The use of any and all examples, or exemplary language provided herein, is intended merely to describe the technical spirit of the disclosure in more detail and does not pose a limitation on the scope of the disclosure unless otherwise claimed. Additionally, when the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values. When referring to "C to D", this means C inclusive to D inclusive unless otherwise specified.

A ferroelectric material has spontaneous polarization due to a non-centrosymmetric charge distribution (e.g., in a material structure crystallized into an orthorhombic crystal phase). Thus, the ferroelectric material has remnant polarization due to a dipole even in an absence of an external electric field. In addition, the direction of polarization may be switched by an external electric field.

In contrast, an anti-ferroelectric material may crystallize, e.g., into a tetragonal crystal phase, such that the anti-ferroelectric material includes an array of electric dipoles, but the remnant polarization of the anti-ferroelectric material may be 0 or close to 0. Thus, the directions of adjacent dipoles become the opposite in the absence of an electric field, so as to offset polarization, and thus, overall spontaneous polarization and remnant polarization may be 0 or close to 0. However, when an external electric field is applied, the anti-ferroelectric material may have polarization characteristics and switching characteristics.

An electronic device according to at least one embodiment may include a mixed material layer in which an orthorhombic crystal phase and a tetragonal crystal phase are mixed and thus a ferroelectric material and an anti-ferroelectric material coexist, and the mixed material layer may be formed such that, in each of positive and negative polarization states, an energy barrier local maximum of the anti-ferroelectric material is located outside an energy well local minimum of the ferroelectric material such that the polarization size becomes larger, so as to have, for example, 3 or less energy barriers or 4 or less energy wells. Accordingly, the mixed material layer may have one, two, or three regions exhibiting an S-curve. Because the mixed material layer expands a region exhibiting negative capacitance, performance boosting of the electronic device due to a negative capacitance effect may be enhanced and expanded.

FIG. 1 is a cross-sectional view schematically illustrating an electronic device 10 according to at least one embodiment. FIG. 1 shows an example in which the electronic device 10 according to at least one embodiment is implemented as a logic transistor and/or a memory transistor.

Referring to FIG. 1, the electronic device 10 includes a channel 11 as a conductive material layer 11*a*, a gate insulating layer 20 including a mixed material layer 30 and covering the channel 11, and a gate electrode 50 as an electrode layer 50*a* on the gate insulating layer 20. In addition, the electronic device 10 according to at least one embodiment may include a first source/drain region 13 and a second source/drain region 15 electrically connected to both ends of the channel 11, respectively. One of the first source/drain region 13 and the second source/drain region 15 may be a source region S, and the other may be a drain region D.

The electronic device 10 according to at least one embodiment has negative capacitance (NC) and may be implemented as a memory device and/or a logic device having two or more threshold voltages.

In at least one embodiment, the conductive material layer 11*a* may be configured to function as conductive region of a channel layer 11. Therefore, in at least some embodiments, the conductive material layer 11*a* may include a semiconductive material, or, as described in further detail below, may include a metallically conductive material (e.g., in reference to FIGS. 15-17). The channel 11 may be formed from a substrate base and/or implemented as a separate material layer. For example, in a case in which the channel 11 is formed from a substrate base, the channel 11 may include semiconductor materials such as silicon (Si), germanium (Ge), silicon germanium (SiGe), silicon carbide (SiC), and/or a group III-V semiconductor material, for example, gallium arsenide (GaAs), indium arsenide (InAs), indium phosphide (InP), and/or the like. In at least some embodiments, the channel 11 may be differentiated from a remainder of the substrate base through the inclusion of dopants. For example, in at least some embodiments, the channel region 11 may include a different concentration and/or different dopant type compared to another region and/or a remainder of the substrate. In addition, in a case in which the channel 11 is not formed from a substrate base but is implemented as a separate material layer, the channel 11 may include Si, Ge, SiGe, SiC, a III-V semiconductor material, an oxide semiconductor, a nitride semiconductor, an oxynitride semiconductor, a two-dimensional (2D) material, quantum dots, an organic semiconductor, and/or the like. For example, the oxide semiconductor may include InGaZnO and/or the like. The 2D material may include transition metal dichalcogenide (TMD) or graphene. The TMD may include a compound of a transition metal and a chalcogen element. For example, the TMD may include $MoS_2$, $MoSe_2$, $MoTe_2$, $wS_2$, $WSe_2$, $WTe_2$, $ZrS_2$, $ZrSe_2$, $HfS_2$, $HfSe_2$, $NbSe_2$, $ReSe_2$, or the like. The quantum dots may include a colloidal quantum dot (QD) or a nanocrystal structure.

The first source/drain region 13 may be formed on one side of the channel 11 and the second source/drain region 15 may be formed on the other side of the channel 11. In a case in which the channel 11 is formed from a substrate base, the first source/drain region 13, the second source/drain region 15, and the channel 11 may be formed by injecting impurities into different regions of a semiconductor substrate, and may include a substrate material as a base material. For example, channel 11 may be a Si channel with Si as a base material. In a case in which the channel 11 is not formed as a substrate base but is implemented as a separate material layer, the first source/drain region 13 and the second source/drain region 15 may be formed of a conductive material. For example, the first source/drain region 13 and the second source/drain region 15 may also include a metal, a metal compound, or a conductive polymer.

In the electronic device 10 according to at least one embodiment, the gate insulating layer 20 may include the mixed material layer 30. The mixed material layer 30 has a material composition in which an orthorhombic crystal phase and a tetragonal crystal phase are mixed and thus a ferroelectric material and an anti-ferroelectric material coexist, and may be formed as a single layer. As noted above, the orthorhombic crystal phase exhibits ferroelectricity, and the tetragonal crystal phase exhibits anti-ferroelectricity. The mixed material layer 30 may have polycrystalline or multiple grains. In addition, the mixed material layer 30 may be provided to have a texture and thus have a preference for a particular crystal orientation. The ratio of the ferroelectric material to the anti-ferroelectric material in the mixed material layer 30 may be adjusted by using the composition and structure of materials, a deposition method, heat treatment conditions, a material type and structure of the first electrode layer 50*a* (e.g., the gate electrode 50), and/or the like.

As will be described below with reference to FIG. 5, the mixed material layer 30 may be formed such that, in each of positive and negative polarization states, an energy barrier local maximum of the anti-ferroelectric material is located outside an energy well local minimum of the ferroelectric material such that the polarization size becomes larger, so as to have, for example, 3 or less energy barriers or 4 or less energy wells. For example, the mixed material layer 30 may be provided to have one to three energy barriers.

To this end, the proportion of the orthorhombic crystal phase in the mixed material layer 30 may be between 35% and 65%. That is, the mixed material layer 30 may be formed such that the ratio of the orthorhombic crystal phase to the tetragonal crystal phase is between 65:35 and 35:65. As such, the mixed material layer 30 may be formed such that the proportion of a major phase in the ferroelectric material and the anti-ferroelectric material is not greater than 65% and the proportion of a minority phase is not less than 35%. In the mixed material layer 30, the ratio of the orthorhombic crystal phase to the tetragonal crystal phase is between 65:35 and 35:65, and the orthorhombic crystal phase and the tetragonal crystal phase are mixed such that the mixed material layer 30 may crystallize to have characteristics in which the ferroelectric material and the anti-ferroelectric material coexist. Such crystallization may be achieved through a heat treatment process as described below.

Accordingly, the mixed material layer 30 may generate one to three regions exhibiting an S-curve in a polarization-electric field relationship, may expand a region exhibiting negative capacitance, and may exhibit negative capacitance characteristics within a range greater than an electric field range exhibiting negative capacitance when a material layer 30 is formed of only a ferroelectric material. For example, the mixed material layer 30 may exhibit negative capacitance within an electric field range of −10 MV/cm to +10 MV/cm. Here, in a comparative case in which the material layer is formed of only a ferroelectric material, the electric field range exhibiting negative capacitance may be, for example, less than about 3 MV/cm.

In at least one embodiment, the mixed material layer 30 may be formed of an oxide containing $Hf_{1-x}A_xO_2$ ($x \leq 0.5$). Here, component A may be at least one selected from Zr, Si, Al, Y, La, Gd, and Sr. In at least one embodiment, component A may be added as a dopant. For example, the mixed material layer 30 may be formed to include a dopant of component A within a material having a hafnia-based fluorite structure. Here, the dopant of component A may be at least one selected from Zr, Si, Al, Y, La, Gd, and Sr, and the doping proportion may be 50% or less ($x \leq 0.5$). The oxide containing $Hf_{1-x}A_xO_2$ ($x \leq 0.5$) may also be referred to as an HAO oxide.

In at least one embodiment, the mixed material layer 30 may be formed of the HAO oxide containing 50% or greater of Hf, that is, having a ratio of Hf to component A of 1:1, or being Hf-rich, or may include a perovskite material.

A matrix material of the mixed material layer 30 may be formed by atomic layer deposition through sequential injection cycles of a Hf precursor and an oxidant, and, for the injection the dopant, sub-cycle (SC) doping (e.g., for injecting and doping a dopant of component AG may be added in a middle of the sequential injection cycles of the Hf precursor and the oxidant for forming the matrix material. Here, for example, the sub-cycle doping may be performed after a Hf precursor injection cycle.

Accordingly, by adding the dopant sub-cycle doping of component A in the middle the sequential injection cycles of the Hf precursor and the oxidant for forming the matrix material through atomic layer deposition and after the precursor injection cycle, the matrix material may be doped with the dopant at a desired concentration, and thus, as described above, the mixed material layer 30 formed of HAO oxide that has Hf and component A in a ratio of 1:1 or that is Hf-rich may be formed.

For example, the mixed material layer 30 may be formed of $Hf_{1-x}Zr_xO_2$ ($x \leq 0.5$) that has a ratio of Hf to Zr of 1:1 and/or that is Hf-rich. In a case in which the mixed material layer 30 is formed as $Hf_{1-x}Zr_xO_2$ ($x \leq 0.5$) that has a ratio of Hf to Zr of 1:1 or that is Hf-rich by doping $HfO_2$ with a Zr dopant, a matrix material of $HfO_2$ may be formed by atomic layer deposition through sequential injection of a Hf precursor and an oxidant, and Zr dopant sub-cycle (SC) doping may be performed after Hf precursor injection in the middle of sequential injection, and then oxidant injection may be performed. Accordingly, the mixed material layer 30 made of $Hf_{1-x}Zr_xO_2$ ($x \leq 0.5$) doped with Zr at a desired concentration may be formed.

Additionally, in a case of forming the mixed material layer 30 made of HAO oxide with a ratio of Hf to component A of 1:1, for example, the mixed material layer 30 may be formed by alternately and repeatedly depositing hafnium oxide ($HfO_2$) and an oxide including component A. That is, the mixed material layer 30 may be formed by a solid solution deposition method. For example, hafnium oxide and an oxide including component A may be alternately deposited in one cycle and/or in a plurality of cycles. Hafnium oxide may be deposited by one cycle or a plurality of cycles of atomic layer deposition through sequential injection of a Hf precursor and an oxidant, and an oxide including component A may be deposited by one cycle or a plurality of cycles of atomic layer deposition through sequential injection of a precursor of component A and an oxidant. As such, the mixed material layer 30 made of HAO oxide with a ratio of Hf to component A of 1:1 may be formed by alternately depositing hafnium oxide and an oxide including component A in one cycle or in a plurality of cycles. Here, component A may be at least one selected from Zr, Si, Al, Y, La, Gd, and Sr. That is, the mixed material layer 30 may be formed as, e.g., $Hf_{0.5}Zr_{0.5}O_2$ (HZO), which is a doped hafnia ferroelectric thin film, by a solid solution deposition method in which hafnium oxide and a dopant oxide are alternately deposited.

In the electronic device 10 according to at least one embodiment, the mixed material layer 30 may be formed to a thickness of, for example, about 0.1 nm to about 20 nm. For example, when the electronic device 10 according to at least one embodiment is implemented as a logic device, the mixed material layer 30 may be formed to a thickness of about 0.1 nm to about 5 nm. For example, when the electronic device 10 according to at least one embodiment is implemented as a memory device, the mixed material layer 30 may be formed to a thickness of about 1 nm to about 20 nm.

Figure 5:
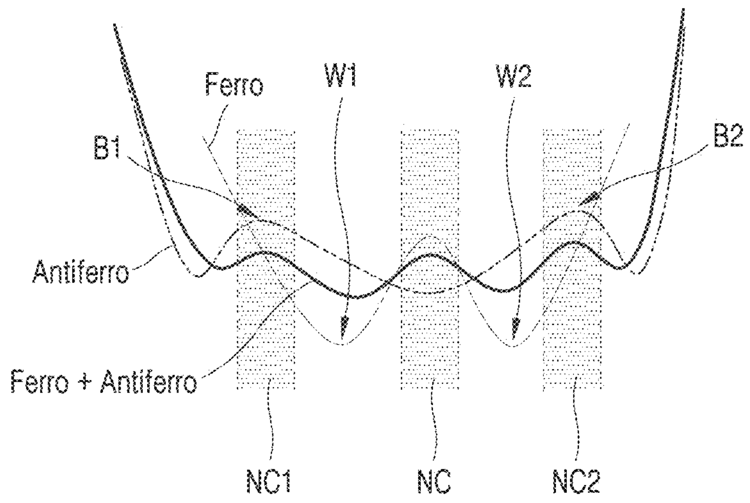
FIG. 5 is a graph showing energy-polarization (U-P) characteristics of a mixed material layer of an electronic device, according to at least one embodiment.

In addition, the mixed material layer 30 may be heat-treated before depositing the electrode layer 50*a*, that is, the gate electrode 50, and selectively additionally heat-treated after depositing the gate electrode 50, so as to have a characteristic in which the orthorhombic crystal phase and the tetragonal crystal phase are mixed in the above ratio and thus a ferroelectric material and an anti-ferroelectric material coexist, such that an energy barrier local maximum of the anti-ferroelectric material is located outside an energy well local minimum of the ferroelectric material as illustrated in FIG. 5. As such, the mixed material layer 30 may be crystallized through heat treatment before being covered with the electrode layer 50*a*, that is, the gate electrode 50, or before and after being covered with the gate electrode 50. As such, in the electronic device 10 according to at least one embodiment, the mixed material layer 30 may be formed to have a characteristic in which the orthorhombic crystal phase and the tetragonal crystal phase are mixed in the mixed material layer 30 in the above-described ratio through a heat treatment process, and thus, the ferroelectric material and the anti-ferroelectric material coexist, and an energy barrier local maximum of the anti-ferroelectric is located outside an energy well local minimum of the ferroelectric material.

Meanwhile, the electrode layer 50*a*, that is, the gate electrode 50, may include a metallically conductive material, such as a metal, a metal nitride, a metal carbide, polysilicon, and/or a 2D conductive material. For example, the electrode layer 50*a* may include an electrode material (e.g., a material with no band gap within the operational temperatures). For example, the metal may include aluminum (Al), tungsten (W), molybdenum (Mo), titanium (Ti), and/or tantalum (Ta). The metal nitride may include titanium nitride (TiN) and/or tantalum nitride (TaN). The metal carbide may be a metal carbide doped with (or containing) aluminum and/or silicon, and as a specific example, may include TiAlC, TaAlC, TiSiC, or TaSiC. The gate electrode 50 may have a structure in which a plurality of materials are stacked, and for example, may have a stack structure of metal nitride layer/metal layer such as TiN/Al, or a stack structure of metal nitride layer/metal carbide layer/metal layer such as TiN/TiAlC/W. As noted above, in at least one embodiment, the material of the electrode layer 50*a* may be selected based on a characteristic of the material to promote the desired ratio of ferroelectric and anti-ferroelectric phases in the mixed material layer 30.

Meanwhile, in the electronic device 10 according to at least one embodiment, the gate insulating layer 20 may further include a dielectric layer 25 between the channel 11 and the mixed material layer 30. The dielectric layer 25 may be formed of, for example, a dielectric material that is not ferroelectric. For example, the dielectric layer 25 may include an anti-ferroelectric or amorphous dielectric material. In another examples, the dielectric layer 25 may be provided between the mixed material layer 30 and the gate electrode 50, and/or may be provided between the channel 11 and the mixed material layer 30 and between the mixed material layer 30 and the gate electrode 50, respectively.

The dielectric layer 25 may serve to stabilize negative capacitance of the mixed material layer 30. The dielectric layer 25 may include, for example, at least one of SiO, AlO, SiON, and SiN, and may have a single-layer or multi-layer structure.

For example, in a case in which the channel 11 includes Si or Ge, the dielectric layer 25 may be formed of, for example, a native oxide layer and/or an oxide layer other than the native oxide layer. As another example, even in a case in which the channel 11 includes Si or Ge, the native oxide layer may be removed, and as in an electronic device 100 illustrated in FIG. 3 to be described below, the mixed material layer 30 may be formed directly on the channel 11.

Figure 2:
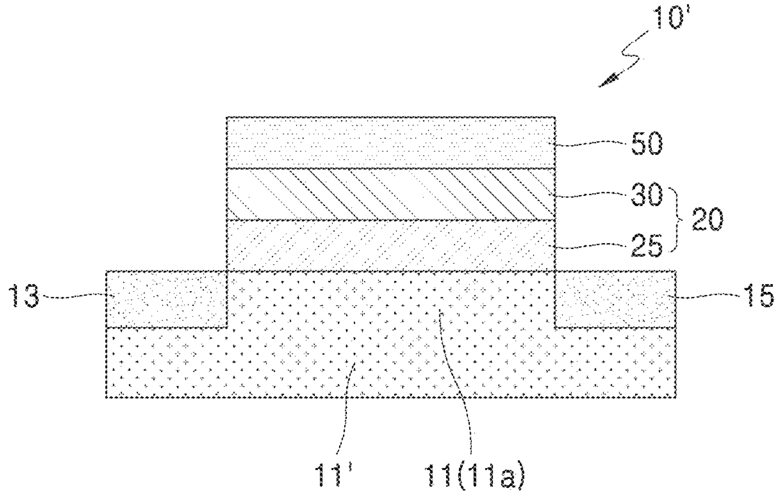

FIG. 2 schematically illustrates an electronic device 10' according to at least one embodiment, and corresponds to an example in which the channel 11 in the electronic device 10 of FIG. 1 is formed by using a semiconductor substrate 11' as a base. As illustrated in FIG. 2, when the channel 11 is formed by using the semiconductor substrate 11' as a base, the first source/drain region 13, the second source/drain region 15, and the channel 11 may be formed by injecting impurities into different regions of the semiconductor substrate 11'.

Figure 3:
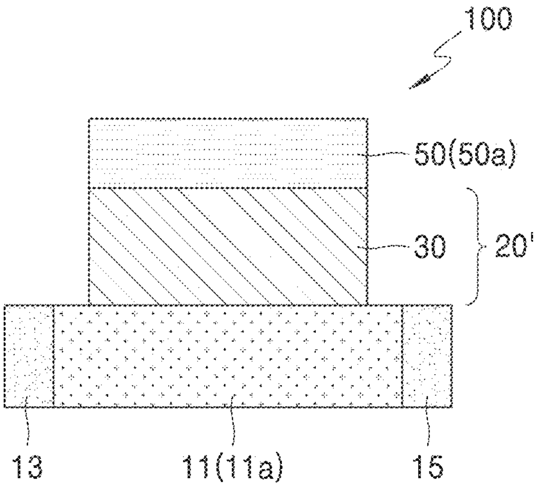

FIG. 3 is a cross-sectional view schematically illustrating the electronic device 100 according to at least one embodiment, and the electronic device 100 is substantially the same as the electronic device 10 according to the embodiment of FIG. 1, except that the mixed material layer 30 is formed directly on the channel 11. As such, the electronic device 100 according to at least one embodiment may not include, for example, a dielectric layer (25 of FIG. 1) between the channel 11 and the mixed material layer 30.

Even in the electronic device 100 according to at least one embodiment, as described above, the channel 11 may be formed as a substrate base and/or implemented as a separate material layer. In addition, the channel 11 may include Si or Ge, and in this case, and the mixed material layer 30 may be formed on the channel 11 after removing a native oxide layer formed on the channel 11.

In the electronic device 100 according to at least one embodiment, in a case in which the channel 11 is formed by using the semiconductor substrate 11' as a base, as in the electronic device 10' exemplarily illustrated in FIG. 2, the first source/drain region 13, the second source/drain region 15, and the channel 11 may be formed by injecting impurities into different regions of the semiconductor substrate 11'.

Figure 4A:
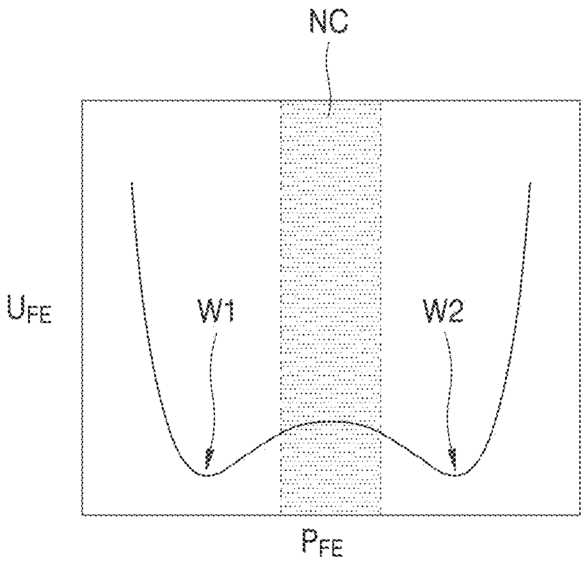
FIG. 4A is a graph showing energy-polarization ($U_{FE}$-$P_{FE}$) characteristics of a ferroelectric material.
Figure 4B:
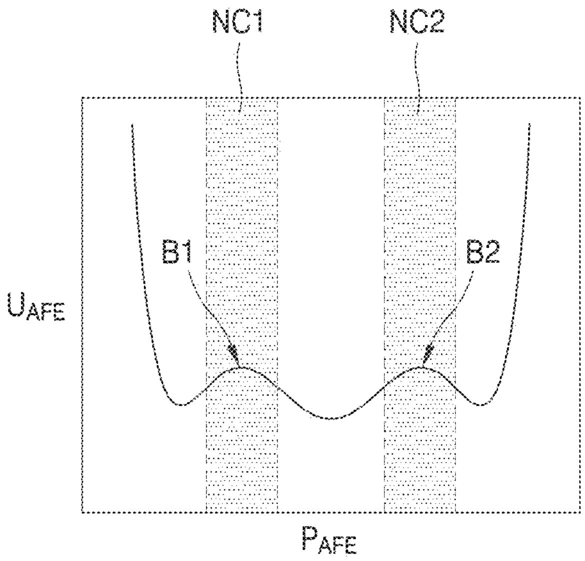
FIG. 4B is a graph showing energy-polarization ($U_{AFE}$-$P_{A}$FE) characteristics of an anti-ferroelectric material.

FIG. 4A is a graph showing energy-polarization ($U_{FE}$-$P_{FE}$) characteristics of a ferroelectric material. FIG. 4B is a graph showing energy-polarization ($U_{AFE}$-$P_{AFE}$) characteristics of an anti-ferroelectric material. In FIGS. 4A and 4B, the horizontal axis represents polarization, and the vertical axis represents energy.

Referring to FIG. 4A, the ferroelectric material (Ferro) has energy wells W1 and W2 on the left and right sides. The two energy wells W1 and W2 correspond to two stable polarization states, and the energy distribution according to such polarization means that hysteresis exists in the polarization-electric field relationship of a thin film. Here, a negative capacitance region NC exists in a transition region between the two energy wells W1 and W2, but the ferroelectric material alone is not stable in terms of energy. However, when the negative capacitance region NC is stabilized in terms of energy through, for example, junction with a dielectric, an S-curve may be obtained in a polarization-electric field relationship graph, and in this case, only the negative capacitance region NC by the ferroelectric material, that is, only one negative capacitance region NC, is included, and the region may be limited to only a low-voltage region near 0 V.

Referring to FIG. 4B, an anti-ferroelectric material (Antiferro) has energy barrier and well characteristics different from those of the ferroelectric material (Ferro). That is, the anti-ferroelectric material has energy barrier local maxima B1 and B2 on the left and right sides, and may have three energy wells. In the energy distribution according to such polarization, a negative capacitance region exists in a region including the energy barrier local maxima B1 and B2, and thus, when the negative capacitance region is stabilized, two S-curves spaced apart from each other exist in the polarization-electric field relationship graph. That is, in the anti-ferroelectric material, negative capacitance regions NC1 and NC2 exist at two positions. In a case in which only the anti-ferroelectric material exists, two S-curves may be obtained but the interval between the two S-curves may be as wide as several volts on a voltage, and because an NC region may be seen only when several volts are applied, the negative capacitance region NC may be limited as it cannot appear in a low-voltage region on the voltage similarly to a case in which only the ferroelectric material exists.

As such, in a case in which only the ferroelectric exists or only the anti-ferroelectric material exists, the negative capacitance region NC may be limited. On the other hand, as in the electronic device 10, 10', and/or 100 according to at least one embodiment, in a case in which an orthorhombic crystal phase and a tetragonal crystal phase are mixed to form the mixed material layer 30 in which a ferroelectric material and an anti-ferroelectric material coexist, and the difference between the proportions of the ferroelectric material and the anti-ferroelectric material is not large as in the above-described embodiment, all S-curves of the ferroelectric material and the anti-ferroelectric material may be utilized, and thus, a negative capacitance region may be expanded to increase, and/or maximize the negative capacitance effect. Thus, according to the electronic device according to at least one embodiment, it is possible to enhance and expand a performance boosting effect of the electronic device by the negative capacitance effect, and thus, the performance improvement of the device may be increased and/or maximized.

FIG. 5 is a graph showing energy-polarization (U-P) characteristics of the mixed material layer 30 of the electronic device 10 or 100, according to at least one embodiment. The energy levels of the graphs indicated by “Ferro”, “Antiferro”, and “Ferro+Antiferro” in FIG. 5 are examples and do not limit the example embodiments, and the difference between the energy levels may vary depending on conditions such as the ratio of the orthorhombic crystal phase and the tetragonal crystal phase, or the thickness of the layer.

Referring to FIG. 5, the graph indicated by “Ferro” shows a relationship between the energy and polarization of a ferroelectric material in the mixed material layer 30, and as described above with reference to FIG. 4A, has energy wells W1 and W2 on the left and right sides with respect to the vertex in the middle. The two energy wells correspond to two stable polarization states, and a region having negative capacitance NC exists in a transition region between the two energy wells W1 and W2.

The graph indicated by “Antiferro” shows a relationship between the energy and polarization of an anti-ferroelectric material in the mixed material layer 30, and as described above with reference to FIG. 4B, it may be seen that the graph has different curves from the graph for the ferroelectric material (Ferro). In the mixed material layer 30, the anti-ferroelectric material (Antiferro) forms a relatively shallow energy well at the vertex of the graph for the ferroelectric material (Ferro), and has energy barrier local maxima B1 and B2 both sides of the energy well, and negative capacitance regions NC1 and NC2 exist in regions including the energy barrier local maxima B1 and B2.

Figure 6:
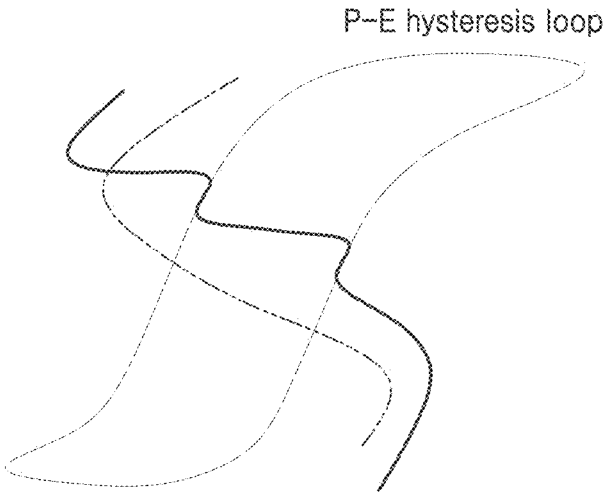
FIG. 6 shows an example of a relationship between an electric field I applied to a mixed material layer of an electronic device and polarization (P), according to at least one embodiment.

According to the electronic device 10, 10', and/or 100 according to at least one embodiment, the mixed material layer 30 is formed such that the energy barrier local maxima B1 and B2 of the anti-ferroelectric material (Antiferro) in each of positive and negative polarization states are located outside energy well local minima W1 and W2 of the ferroelectric material (Ferro). Accordingly, as shown in FIG. 5, in the mixed material layer 30, a negative capacitance region NC due to the ferroelectric material and negative capacitance regions NC1 and NC2 due to the anti-ferroelectric material may be distinguished from each other, and a combination of the ferroelectric material and the anti-ferroelectric material (Ferro+Antiferro) may have, for example, 3 or less energy barriers and/or 4 or less energy wells. Accordingly, when an electric field is applied to the mixed material layer 30, as may be seen in the graph of FIG. 6 showing a relationship between polarization (P) and the electric field, the electronic device 10, 10', and/or 100 including the mixed material layer 30 may exhibit one to three S-curves. FIG. 5 shows that the negative capacitance region NC due to the ferroelectric material and the negative capacitance regions NC1 and NC2 due to the anti-ferroelectric material are separated from each other, but this is only an example and the disclosure is not limited thereto. For example, the mixed material layer 30 may be formed such that the negative capacitance region due to the ferroelectric material and the negative capacitance regions NC1 and NC2 due to the anti-ferroelectric material are connected to or close to each other.

FIG. 6 shows a relationship between an electric field (E) applied to the mixed material layer 30 of the electronic device 10 or 100, and polarization (P), according to at least one embodiment.

Referring to FIG. 6, it may be seen that, in a case in which only a ferroelectric material with an orthorhombic crystal phase exists, an S-curve that appears when the negative capacitance region NC is stabilized in terms of energy is generated within a coercive field of a polarization-electric field hysteresis loop (P-E hysteresis loop) that appears when the negative capacitance region is not stabilized, whereas, in a case in which negative capacitance regions NC are stabilized in the energy-polarization relationship by a combination of the ferroelectric material and the anti-ferroelectric material (Ferro+Antiferro) in the embodiment, the polarization-electric field relationship graph has an S-curve shape due to negative capacitance, and the negative capacitance region having a negative slope may also exist outside a coercive field of a P-E hysteresis loop drawn when only the ferroelectric material in which the negative capacitance (NC) is not stabilized. FIG. 6 shows that, not only when the mixed material layer 30 is formed to show three S-curves, but also when it is formed to show one S-curve, the S-curve is expanded to a region outside the P-E hysteresis loop, and accordingly, the negative capacitance range may be expanded in an electric field (E-field) axis more than in a case in which only an orthorhombic crystal phase exists.

As such, as in the mixed material layer 30 according to at least one embodiment, when the orthorhombic crystal phase and the tetragonal crystal phase are mixed in the above-described ratio, the negative capacitance range may be expanded in the electric field (E-field) axis than by the orthorhombic crystal phase, and the number of S-curves may be one or greater, and/or up to three.

Figure 7A:
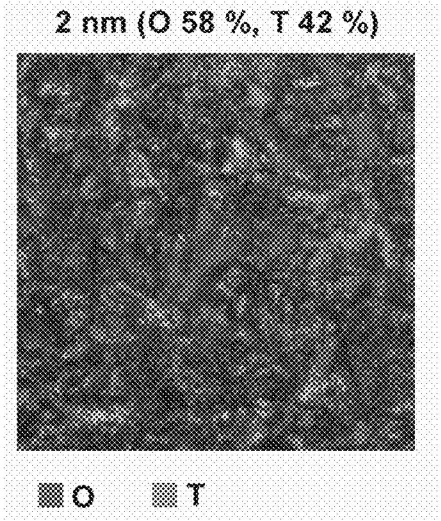
FIG. 7A shows a sample according to at least one embodiment in which $Hf_{1-x}Zr_xO_2$ ($x \leq 0.5$) is formed by mixing about 58% of an orthorhombic crystal phase (O) with about 42% of a tetragonal crystal phase (T)
Figure 7B:
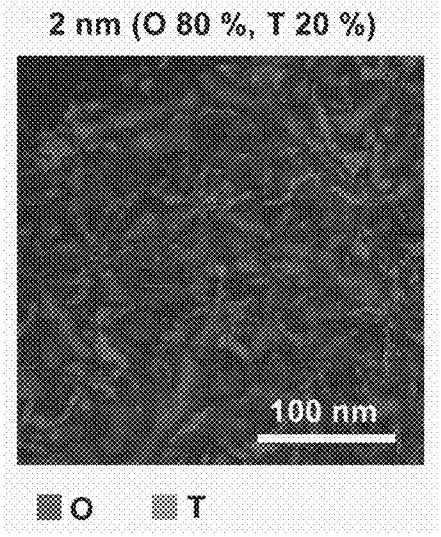
FIG. 7B shows a sample according to a comparative example in which $Hf_{1-x}Zr_xO_2$ ($x \leq 0.5$) is formed by mixing about 80% of an orthorhombic crystal phase (O) with about 20% of a tetragonal crystal phase (T)
Figure 7C:
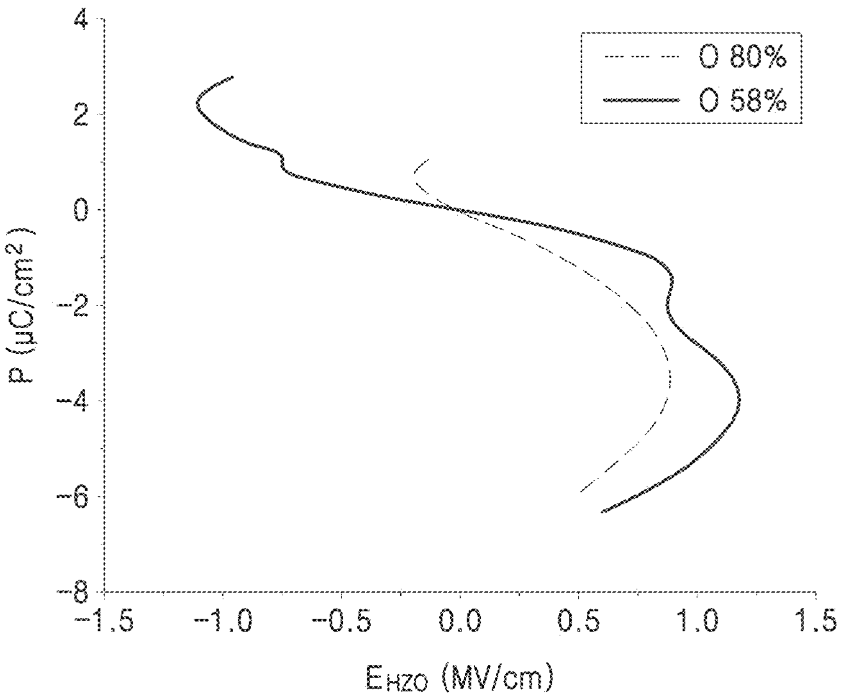
FIG. 7C is a graph showing a relationship between polarization (P) and an electric field ($E_{HZO}$) for the sample of the embodiment of FIG. 7A and the sample of the comparative example of FIG. 7B.

FIG. 7A shows a sample according to at least one embodiment in which $Hf_{1-x}Zr_xO_2$ (x≤0.5) is formed by mixing about 58% of an orthorhombic crystal phase (O) with about 42% of a tetragonal crystal phase (T). FIG. 7B shows a sample according to a comparative example in which $Hf_{1-x}Zr_xO_2$ (x≤0.5) is formed by mixing about 80% of an orthorhombic crystal phase (O) with about 20% of a tetragonal crystal phase (T). FIG. 7C is a graph showing a relationship between polarization (P) and an electric field ($E_{HZO}$) for the sample of the embodiment of FIG. 7A and the sample of the comparative example of FIG. 7B.

It may be seen from FIGS. 7A to 7C that, in the sample of the embodiment, about 58% of the orthorhombic crystal phase (O) and about 42% of the tetragonal crystal phase (T) are mixed, and three S-curves appears, and thus, when the proportion of the orthorhombic crystal phase of the mixed material layer 30 is in the range of 35% to 65%, the negative capacitance region may be expanded, and one to three S-curves may be obtained.

On the other hand, it may be seen that, in the sample of the comparative sample, about 80% of the orthorhombic crystal phase (O) and about 20% of the tetragonal crystal phase (T) are mixed, and one S-curve appears but no effect of expanding the negative capacitance region is obtained. From this, it may be seen that when the portion of the orthorhombic crystal phase is out of the range of 35% to 65% as in the sample of the comparative example, the effect of expanding the negative capacitance region is not obtained.

Figure 8:
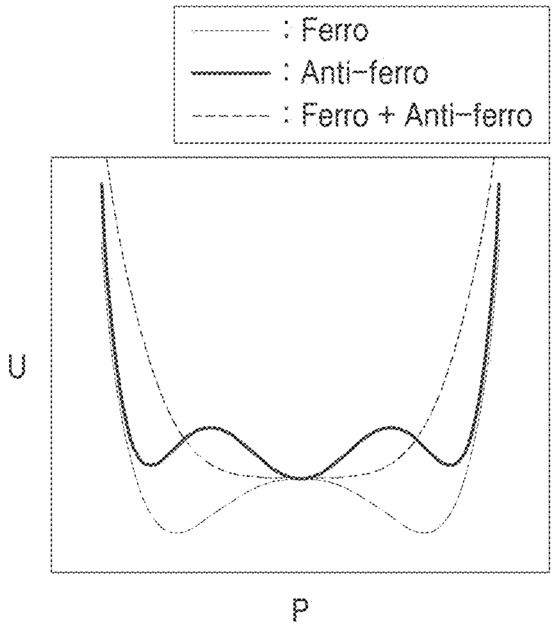
FIG. 8 is a graph showing energy-polarization (U-P) characteristics of a comparative example in which negative capacitance regions of a ferroelectric material and an anti-ferroelectric material overlap each other.

FIG. 8 is a graph showing energy (U)-polarization (P) characteristics of a comparative example in which negative capacitance regions of a ferroelectric material and an anti-ferroelectric material overlap each other. In FIG. 8, the horizontal axis represents polarization, and the vertical axis represents energy.

Referring to FIG. 8, the graph of the ferroelectric material (Ferro) has energy wells on the left and right sides. The two wells correspond to two stable polarization states. A negative capacitance region exists in a transition region between the two energy wells. The graph of the anti-ferroelectric material has different curves from the graph of the ferroelectric material, but the negative capacitance regions overlap each other. In this case, the negative capacitance region due to a combination of the ferroelectric material and the anti-ferroelectric material (Ferro+Anti-ferro) has no effect of being separated into two or more regions or being expanded compared to the negative capacitance region of the ferroelectric material.

As may be seen from comparison between FIGS. 5 and 8, as in the electronic device 10, 10' and/or 100 according to at least one embodiment, by forming the mixed material layer 30 such that the energy barrier local maxima B1 and B2 of the anti-ferroelectric material (Antiferro) in each the positive and negative polarization states are located outside the energy wall local minima W1 and W2 of the ferroelectric material (Ferro), that is, such that the polarization size increases, it is possible to obtain one to three S-curves may be obtained and expand the negative capacitance region, and thus, performance boosting by the negative capacitance effect may be created from a subthreshold region to an on-state region.

In the above, it is illustrated that the electronic device 10, 10', and/or 100 according to at least one embodiment is a field-effect transistor having the planar channel 11, but the disclosure is not limited thereto. For example, the concept according to the above-described embodiment may be applied to a fin field-effect transistor (FinFET), a gate-all-around FET (GAAFET), or a multi-bridge channel FET (MBCFET) having a three-dimensional (3D) channel structure.

Figure 9:
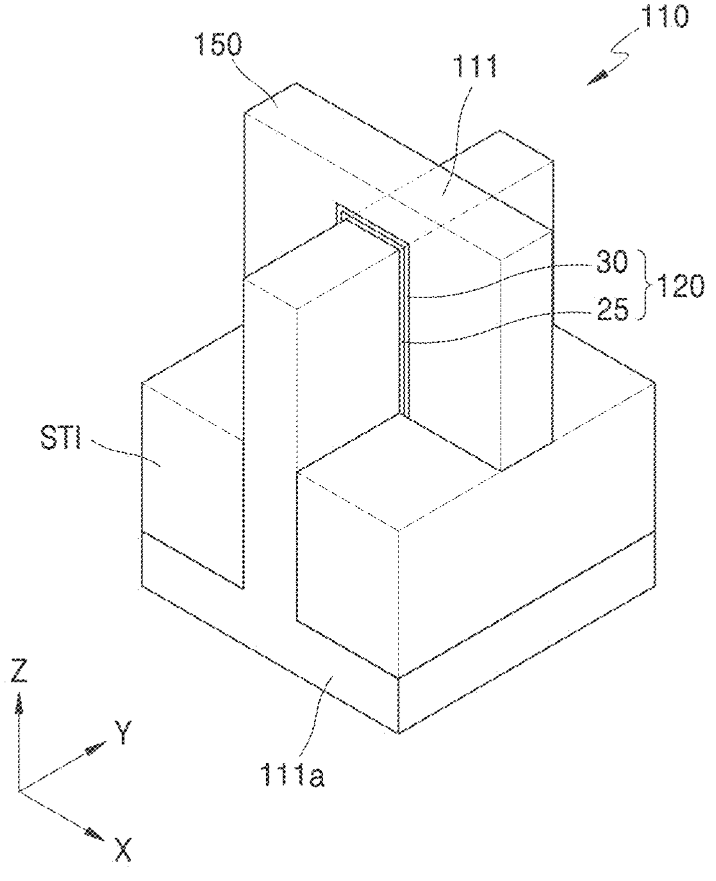
FIG. 9 illustrates an example in which an electronic device is formed in a three-dimensional structure including a fin channel, according to at least one embodiment.

FIG. 9 illustrates an example in which an electronic device 110 is formed in a 3D structure including a fin channel 111, according to at least one embodiment.

Referring to FIG. 9, the electronic device 110 according to at least one embodiment may be provided to have the fin channel 111 that protrudes in a Z-direction from the upper surface of a substrate 111*a* and extends in a Y-direction. A first source/drain region and a second source/drain region protruding in the Z-direction from the upper surface of the substrate 111*a* may be provided on both sides of the Fin channel 111. In other words, a first end of the channel 111 may be in contact with the first source/drain region and a second end of the channel 111 may be contact with the second source/drain region. The channel 111 may include, for example, a relatively lightly doped p-type semiconductor or a relatively lightly doped n-type semiconductor.

In addition, for example, a shallow trench insulator (STI) may be formed for electrical separation from adjacent devices (not shown) and to form a gate electrode 150 surrounding the channel 111. The STI may be formed by forming a shallow trench around the channel 111 or a region corresponding to the channel 111 and filling the trench with an insulating material. The gate electrode 150 may be formed on the STI to surround the channel 111. A gate insulating layer 120 may be provided between the channel 111 and the gate electrode 150. For example, the electronic device 110 having a fin channel structure may be formed by forming the gate insulating layer 120 to surround the channel 111 and forming the gate electrode 150 to surround the gate insulating layer 120. The electronic device 110 illustrated in FIG. 9 may be, for example, a FinFET.

As in the electronic devices 10, 10', and 100 described above with reference to FIGS. 1 and 2, in the electronic device 110 according to at least one embodiment, the gate insulating layer 120 may include the mixed material layer 30 in which a ferroelectric material and an anti-ferroelectric material coexist and the dielectric layer 25, or may include the mixed material layer 30 in which the ferroelectric material and the anti-ferroelectric material coexist and the dielectric layer 25 may be omitted. FIG. 9 illustrates an example in which the gate insulating layer 120 includes the mixed material layer 30 in which the ferroelectric material and the anti-ferroelectric material coexist, and the dielectric layer 25.

Figure 10:
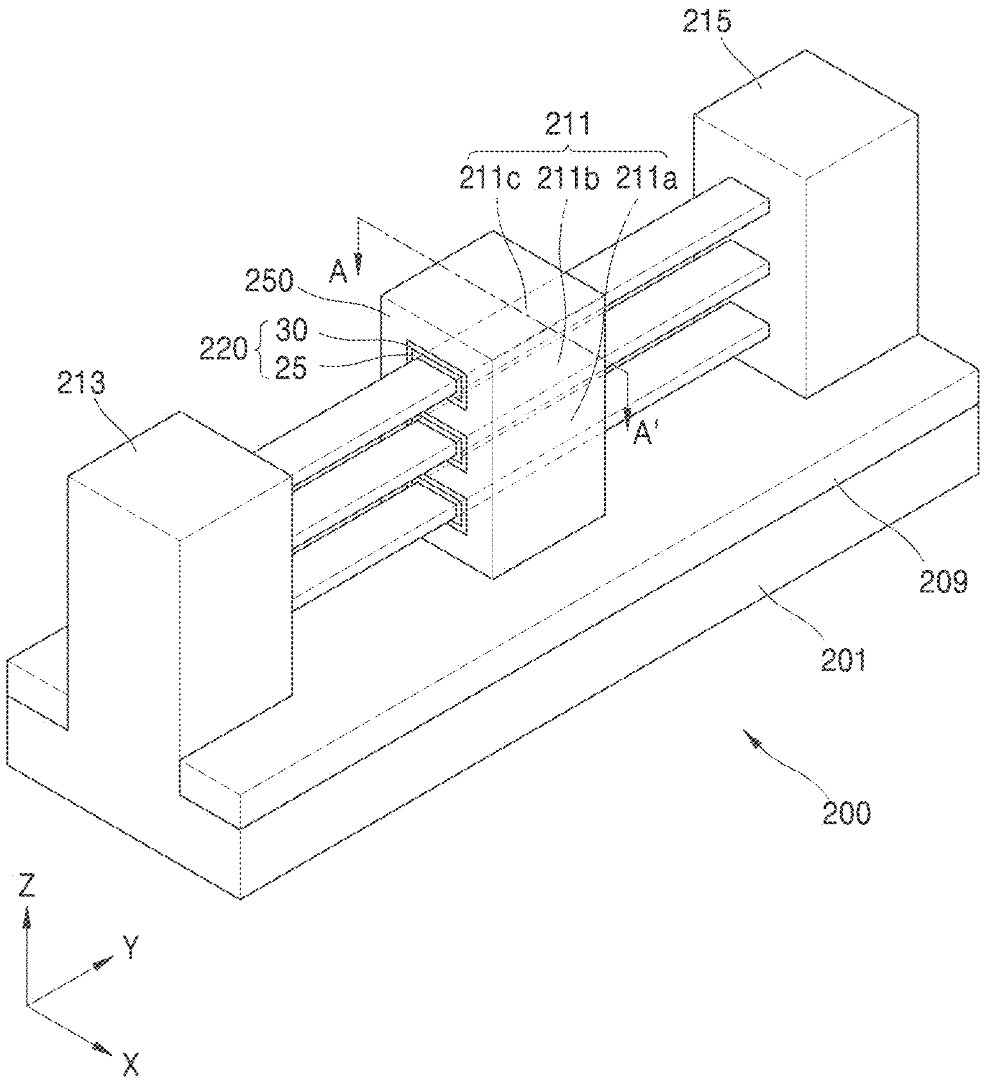
FIG. 10 illustrates an example in which an electronic device is formed in a three-dimensional structure in which a gate electrode surrounds a channel in all directions, according to at least one embodiment.

FIG. 10 illustrates an example in which an electronic device 200 is formed in a 3D structure in which a gate electrode 250 surrounds a channel 211 in all directions, according to at least one embodiment.

Referring to FIG. 10, the electronic device 200 may include a substrate 201, a first source/drain region 213 protruding in the Z-direction from the upper surface of the substrate 201, a second source/drain region 215 protruding in the Z-direction from the upper surface of the substrate 201, the channel 211 having a bar shape extending in the Y-direction and spaced apart from the upper surface of the substrate 201, a gate insulating layer 220 surrounding and covering the channel 211, and the gate electrode 250 surrounding and covering the gate insulating layer 220. The channel 211 may extend in the Y-direction and be connected between the first source/drain region 213 and the second source/drain region 215. In other words, a first end of the channel 211 may be contact with the first source/drain region 213 and a second end of the channel 211 may be contact with the second source/drain region 215. The channel 211 may include a relatively lightly doped p-type semiconductor or a relatively lightly doped n-type semiconductor. The channel 211 may include a plurality of channel elements 211*a*, 211*b*, and 211*c* arranged at intervals therebetween in the Z-direction and/or an X-direction different from the Y-direction. Although FIG. 10 illustrates that three channel elements 211*a*, 211*b*, and 211*c* are arranged in the Z-direction at intervals, this is merely an example and the disclosure is not limited thereto. The electronic device 200 illustrated in FIG. 10 may be referred to as, for example, a GAAFET or an MBCFET.

Figure 11:
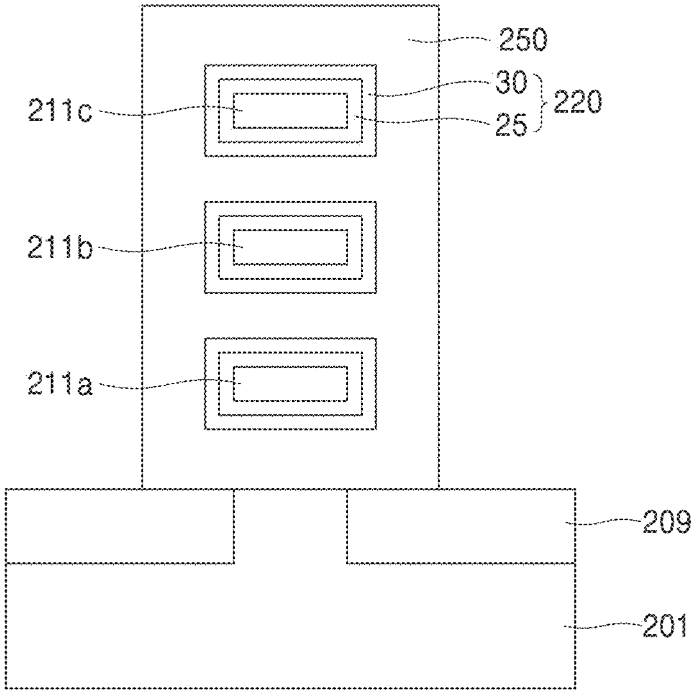
FIG. 11 is a cross-sectional view schematically illustrating a gate structure of the electronic device illustrated in FIG. 10.

FIG. 11 is a cross-sectional view schematically illustrating a gate structure of the electronic device 200 illustrated in FIG. 10, and in particular, schematically illustrates a cross-section of the gate structure taken along line A-A'.

Referring to FIG. 11, the electronic device 200 may include a plurality of gate insulating layers 220 arranged to surround four surfaces of the plurality of channel elements 211*a*, 211*b*, and 211*c*, respectively. As in the electronic devices 10 and 100 described above with reference to FIGS. 1 and 2, the gate insulating layer 220 may include the mixed material layer 30 in which a ferroelectric material and an anti-ferroelectric material coexist and the dielectric layer 25, and/or may include the mixed material layer 30 in which the ferroelectric material and the anti-ferroelectric material coexist and the dielectric layer 25 may be omitted. FIGS. 10 and 11 illustrate an example in which the gate insulating layer 220 includes the dielectric layer 25 and the mixed material layer 30, and the dielectric layer 25 and the mixed material layer 30 are arranged to surround four surfaces of the channel elements 211*a*, 211*b*, and 211*c*. Meanwhile, the gate electrode 250 may have a structure extending in the Z-direction and protruding from the upper surface of the substrate 201 so as to surround four surfaces of the gate insulating layer 220.

The electronic devices 10, 10', 100, 110, and 200 described above may be employed in various electronic apparatuses. For example, the electronic devices 10, 10', 100, 110, and 200 described above may be used as logic transistors or memory transistors. In addition, the electronic devices 10, 10', 100, 110, and 200 described above may be utilized as memory cells, and may constitute a memory cell array in which a plurality of memory cells are arranged two-dimensionally, arranged in one vertical or horizontal direction, or arranged in one direction to form a memory cell string and a plurality of memory cell strings are two-dimensionally arranged. In addition, the above-described electronic devices may constitute part of an electronic circuit constituting an electronic apparatus together with other circuit elements such as capacitors.

Figure 12:
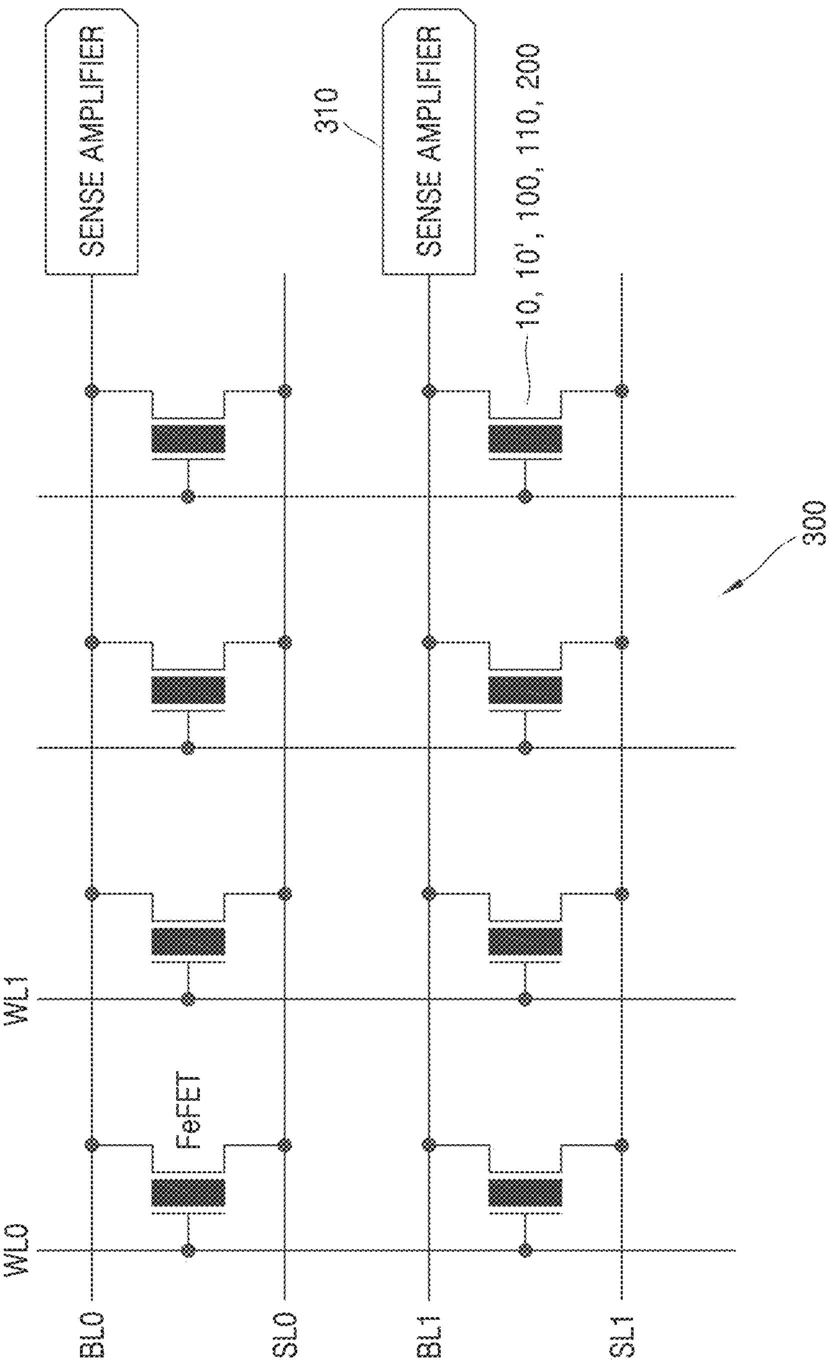
FIG. 12 is a schematic circuit diagram of a memory device including an electronic device array.

FIG. 12 is a schematic circuit diagram of a memory device including an electronic device array. Referring to FIG. 12, a memory device 300 may include an array of a plurality of electronic devices 10, 10', 100, 110, or 200 that are two-dimensionally arranged. In addition, the memory device 300 may include a plurality of bit lines BL0 and BL1, a plurality of select lines SL0 and SL1, and a plurality of word lines WL0 and WL1. The select lines SL0 and SL1 may be electrically connected to first source/drain regions of the electronic device 10, 10', 100, 110, or 200, the bit lines BL0 and BL1 may be electrically connected to second source/drain regions of the electronic device 10, 10', 100, 110, or 200, and the plurality of word lines WL0 and WL1 may be electrically connected to gate electrodes of the electronic devices 10, 10', 100, 110, or 200. In addition, the memory device 300 may further include an amplifier 310 for amplifying signals output from the bit lines BL0 and BL1. Each of the electronic devices 10, 10', 100, 110, or 200 may be one memory cell of the memory device 300.

Although illustrated as a two-dimensional plane in FIG. 12 for convenience, the memory device 300 may have a stack structure of two or more stages. For example, the plurality of bit lines BL0 and BL1 and the plurality of select lines SL0 and SL1 extending in a vertical direction may be two-dimensionally arranged, and the plurality of word lines WL0 and WL1 extending in a horizontal direction may be respectively arranged in a plurality of layers. However, the disclosure is not limited thereto, and memory cells may be three-dimensionally arranged in various manners.

Figure 13:
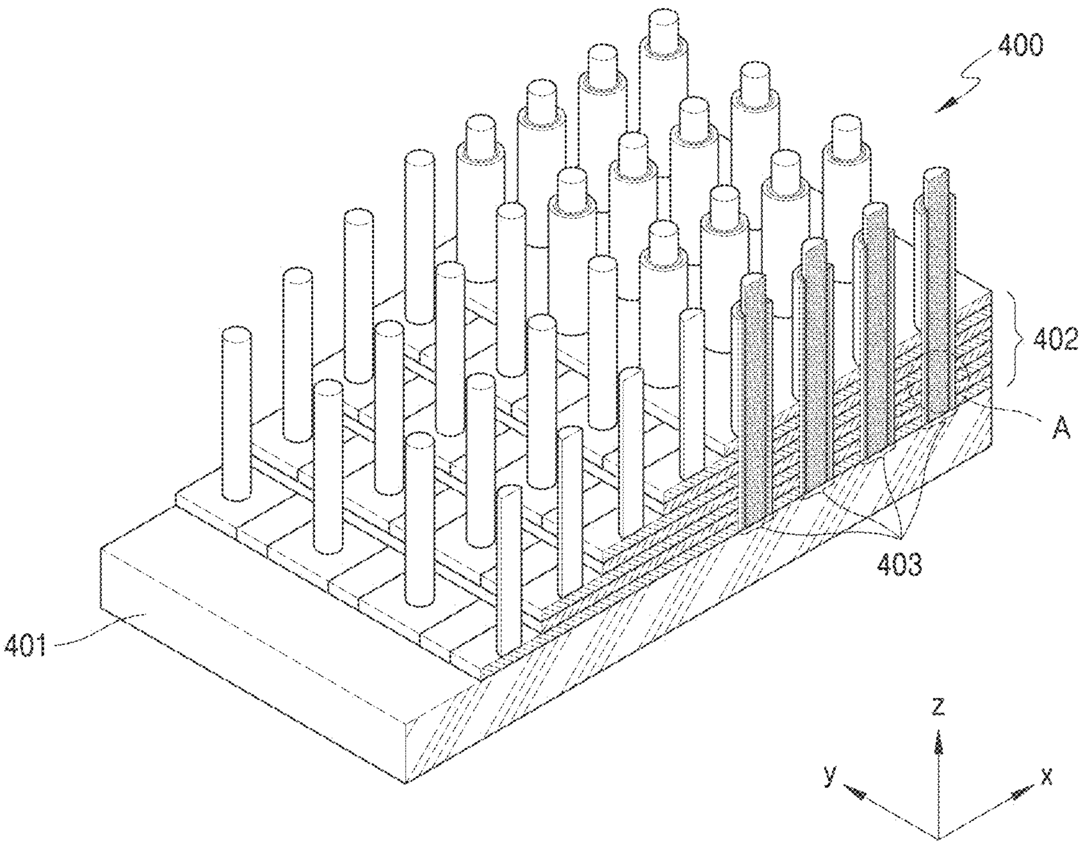
FIG. 13 is a perspective view illustrating an electronic device according to at least one embodiment.
Figure 14:
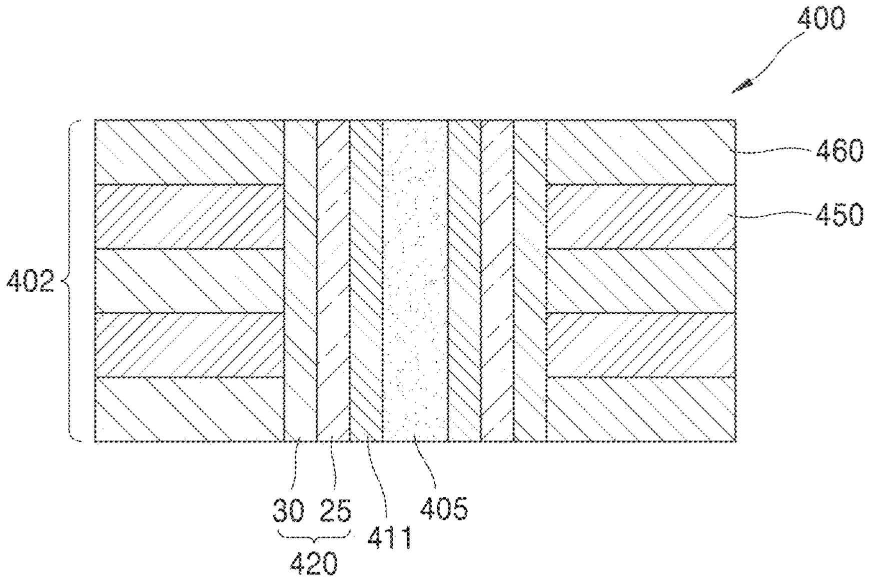
FIG. 14 is an enlarged cross-sectional view of portion A of FIG. 13.

FIG. 13 is a perspective view illustrating an electronic device 400 according to at least one embodiment, and FIG. 14 is an enlarged cross-sectional view of portion A of FIG. 13. The electronic device 400 illustrated in FIG. 13 may be a memory cell string of a three-dimensional (or vertical) NAND (VNAND) or three-dimensional FeFET memory.

Referring to FIG. 13, the electronic device 400 may include a stack structure 402 in which a plurality of insulating layers 460 and a plurality of gate electrodes 450 are alternately and repeatedly stacked, a plurality of channel holes may be formed to penetrate the stack structure 402, and a gate insulating layer 420, a channel 411, and a dielectric filler 405 may be arranged concentrically inside the channel hole to form a memory cell string, and a plurality of memory cell strings may be two-dimensionally arranged.

As in the electronic devices 10 and 100 described above with reference to FIGS. 1 and 2, the gate insulating layer 420 may include the mixed material layer 30 in which a ferroelectric material and an anti-ferroelectric material coexist, and the dielectric layer 25, or may include only the mixed material layer 30. FIGS. 13 and 14 illustrate an example in which the gate insulating layer 420 includes the dielectric layer 25 and the mixed material layer 30.

For example, the plurality of insulating layers 460 and the plurality of gate electrodes 450 each extend along an X-Y plane on a substrate 401 and are alternately and repeatedly stacked in the Z-direction to form the stack structure 402. In addition, the electronic device 400 may include the gate insulating layer 420 including the mixed material layer 30 and the dielectric layer 25, a cell string 403 including the channel 411 and the dielectric filler 405, and the cell string 403 may be arranged to penetrate the stack structure 402. In other words, the insulating layers 460 and the gate electrodes 450 may be arranged to surround the periphery of the cell string 403. In detail, the gate insulating layer 420 including the mixed material layer 30 and the dielectric layer 25, the channel 411, and the dielectric filler 405 may all extend in the Z-direction to intersect with the insulating layers 460 and the gate electrodes 450.

In addition, the dielectric filler 405 may be arranged at a central portion of the cell string 403, and the gate insulating layer 420 including the mixed material layer 30 and the dielectric layer 25, and the channel 411 may be arranged to concentrically surround the dielectric filler 405. The dielectric layer 25 may be arranged between the mixed material layer 30 and the channel 411. In at least some embodiments, the gate insulating layer 420 may include the mixed material layer 30 in which a ferroelectric material and an anti-ferroelectric material coexist and the dielectric layer 25, or may include the mixed material layer 30 in which the ferroelectric material and the anti-ferroelectric material coexist and the dielectric layer 25 may be omitted. The electronic device 400 may include a plurality of cell strings 403, and the cell strings 403 may be two-dimensionally arranged on an X-Y plane to be spaced apart from each other.

Figure 15:
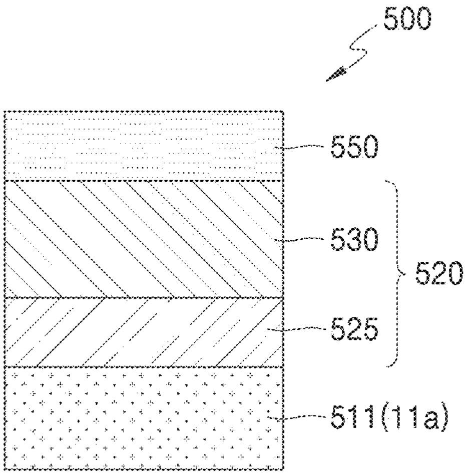
FIGS. 15 and 16 are cross-sectional views schematically illustrating electronic devices according to some embodiments.
Figure 16:
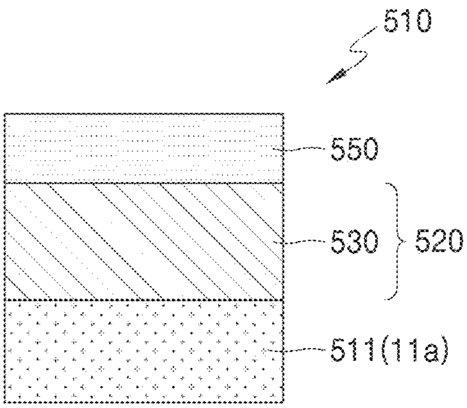

As another example, as illustrated in FIGS. 15 and 16, an electronic device 500 or 510 according to at least one embodiment may include another electrode layer 511 as the conductive material layer 11*a* so as to be implemented as a capacitor. In addition, the electronic device 500 or 510 according to at least one embodiment may be implemented as a capacitor and may be a partial component of an electronic circuit implemented as an integrated device.

FIGS. 15 and 16 are cross-sectional views schematically illustrating the electronic devices 500 and 510 according to at least one embodiment.

Referring to FIGS. 15 and 16, the electronic device 500 or 510 according to at least one embodiment includes an electrode layer 550, an electrode layer 511 spaced apart from the electrode layer 550, and an insulating layer 520 arranged between the electrode layer 550 and the electrode layer 51. The electrode layer 511 corresponds to the conductive material layer 11*a*. The insulating layer 520 includes a mixed material layer 530 covering the electrode layer 511 and may further include a dielectric layer 525. FIG. 15 illustrates an example in which the insulating layer 520 includes the dielectric layer 525 between the electrode layer 511 and the mixed material layer 530. FIG. 16 illustrates an example in which the insulating layer 520 includes only the mixed material layer 530. The electronic device 500 or 510 according to at least one embodiment may be provided to expand a negative capacitance region and may be implemented as a capacitor or a ferroelectric memory.

The electrode layer 550 and the electrode layer 511 may include a conductive material. For example, the electrode layer 550 and the electrode layer 511 may each include a metal (and/or an alloy thereof), a metal nitride, a metal carbide, a metal oxide, a two-dimensional conductive material, and/or a combination thereof. For example, the metal may include at least one of aluminum (Al), tungsten (W), molybdenum (Mo), titanium (Ti), tantalum (Ta), chromium (Cr), and copper (Cu), an alloy thereof, and/or the like. The metal nitride may include, for example, titanium nitride (TiN), tantalum nitride (TaN), and/or the like. The metal carbide may include a metal carbide doped with (or containing) at least one of aluminum and silicon, for example, TiAlC, TaAlC, TiSiC, or TaSiC. The metal oxide may include, for example, indium oxide ($In_2O_3$), tin oxide ($SnO_2$), zinc oxide (ZnO), indium oxide-tin oxide alloy ($In_2O_3$—$SnO_2$:ITO), indium oxide-zinc oxide alloy ($In_2O_3$—ZnO), and/or the like. At least one of the electrode layer 550 and the electrode layer 511 may include a plurality of layers, and may have, for example, a stack structure of metal nitride layer/metal layer or a stack structure of metal nitride layer/metal carbide layer/metal layer.

The mixed material layer 530 may correspond to the mixed material layer 30 described above with reference to FIGS. 1 and 2 and may cover the electrode layer 511. Like the mixed material layer 30 described above, the mixed material layer 530 may be formed such that an orthorhombic crystal phase and a tetragonal crystal phase are mixed and thus and a ferroelectric material and an anti-ferroelectric material coexist, so as to exhibit one to three S-curves and expand negative capacitance. The description of the mixed material layer 30 provided above is applied to the mixed material layer 530, and redundant descriptions thereof will be omitted.

The dielectric layer 525 may be formed of, for example, a dielectric material that is not ferroelectric. For example, the dielectric layer 525 may include an amorphous or anti-ferroelectric dielectric material. The dielectric layer 525 may correspond to the dielectric layer 25 described above with reference to FIG. 1, and may include, for example, at least one of SiO, AlO, SiON, and SiN. The dielectric layer 525 may include a plurality of layers having different dielectric constants. The description of the dielectric layer 25 provided above is applied to the dielectric layer 525, and redundant descriptions thereof will be omitted.

Figure 17:
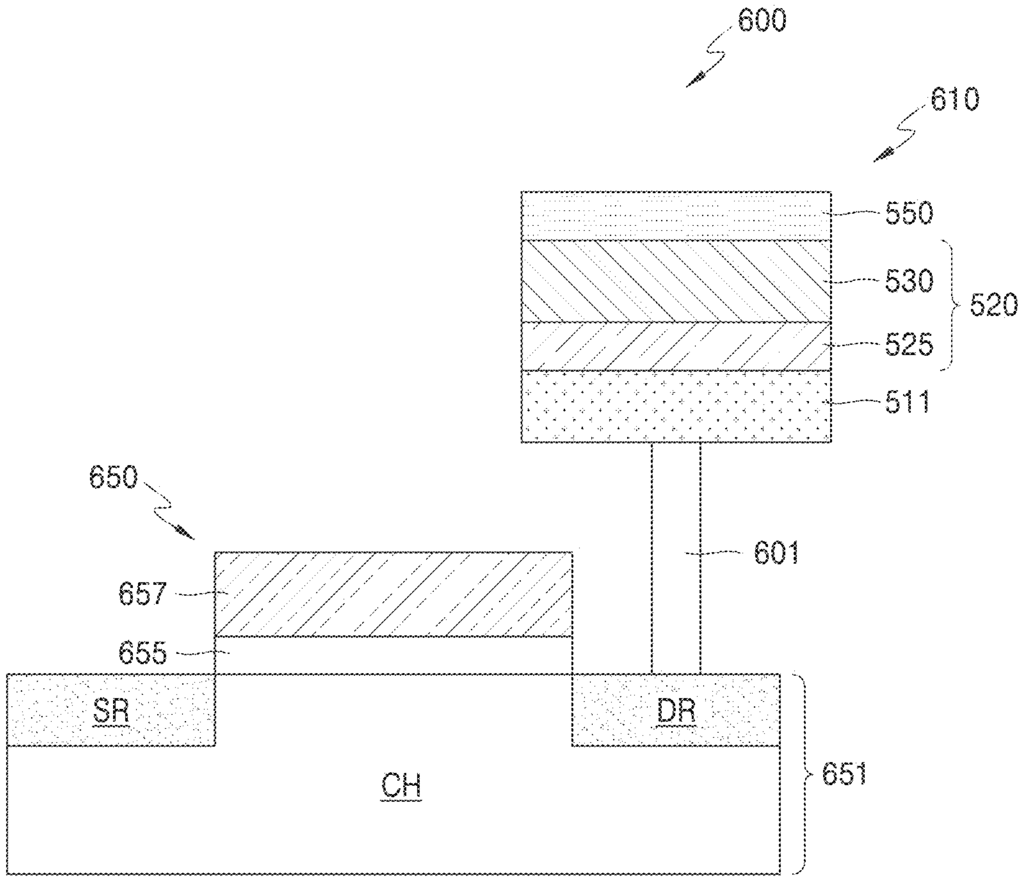
FIG. 17 schematically illustrates an example of applying an electronic device according to at least one embodiment.

FIG. 17 schematically illustrates an example of applying an electronic device according to at least one embodiment.

Referring to FIG. 17, an electronic device 600 may include a structure in which a capacitor 610 and a transistor 650 are electrically connected to each other, and may be a partial component of an electronic circuit implemented as an integrated device.

As the capacitor 610, the electronic device 500 or 510 of FIG. 15 or 16 may be used. The capacitor 610 may have, for example, a stack structure of the electrode layer 511, the insulating layer 520, and the electrode layer 550, and the insulating layer 520 may include the dielectric layer 525 and the mixed material layer 530 or, may include only the mixed material layer 530. FIG. 17 illustrates an example in which the electronic device 500 of FIG. 15 is used as the capacitor 610.

The capacitor 610 may be electrically connected to the transistor 650, e.g., through a contact 601. The transistor 650 may be a field-effect transistor. One of the electrodes 511 and 550 of the capacitor 610 may be electrically connected to one of a source SR and a drain DR of the transistor 650 through the contact 601.

The transistor 650 may include a semiconductor substrate 651 including the source SR, the drain DR, and a channel CH, and a gate electrode 657 arranged to face the channel CH, and may include a gate insulating layer 655 arranged between the channel CH and the gate electrode 657.

The semiconductor substrate 651 may include a semiconductor material. The semiconductor substrate 651 may include the source SR, the drain DR, and the channel CH electrically connected to the source SR and the drain DR. The source SR may be electrically connected to or in contact with one end of the channel CH, and the drain DR may be electrically connected to or in contact with the other end of the channel CH. In other words, the channel CH may be defined as a substrate region between the source SR and the drain DR in the semiconductor substrate 651.

The source SR, the drain DR, and the channel CH may be independently formed by injecting impurities into different regions of the semiconductor substrate 651, and in this case, the source SR, the channel CH, and the drain DR may include a substrate material as a base material. In addition, the source SR and the drain DR may be formed of a conductive material. The channel CH may not be formed as a substrate base, but may be implemented as a separate material layer.

The gate electrode 657 may be arranged on the semiconductor substrate 651 to be spaced apart from the semiconductor substrate 651 and face the channel CH.

The gate insulating layer 655 arranged between the semiconductor substrate 651 and the gate electrode 657 may include a paraelectric material or a high-k material. The gate insulating layer 655 and the gate electrode 657 may constitute a gate stack.

Alternatively, as the transistor 650, the electronic device 10, 10', and/or 100 according to at least one embodiment described above with reference to FIGS. 1 and 3 may be used. In addition, the transistor 650 may have various channel structures like the electronic devices 110 and 200 described above with reference to FIGS. 9 to 11.

The contact 601 may include any suitably conductive material, for example, tungsten, copper, aluminum, polysilicon, and/or the like.

The arrangement of the capacitor 610 and the transistor 650 may be variously modified. For example, the capacitor 610 may be arranged on the semiconductor substrate 651 as illustrated, or may be buried in the semiconductor substrate 651.

Although FIG. 17 illustrates the electronic device 600 having one capacitor 610 and one transistor 650, the electronic device 600 may have a structure in which capacitors 610 and transistors 650 are two-dimensionally and repeatedly arranged.

In the electronic device according to the various embodiments described above and an electronic apparatus to which the electronic device is applied, thin film deposition may be performed by using various deposition methods such as atomic layer deposition (ALD), metal organic ALD (MOALD), chemical vapor deposition (CVD), metal organic CVD (MOCVD), or physical vapor deposition (PVD). In addition, doping may be performed by using methods such as light ion implant, plasma treatment, or annealing under specific atmosphere, in addition to the above deposition methods.

According to the electronic device according to various embodiments described above, in a metal-oxide-semiconductor capacitor (MOSCAP) structure (including a gate stack) or a capacitor structure in which a mixed material layer in which an orthorhombic crystal phase and a tetragonal crystal phase are mixed and thus a ferroelectric material and an anti-ferroelectric material coexist, and a dielectric layer are stacked, a negative capacitance region may be expanded compared to a structure to which only a ferroelectric material or an anti-ferroelectric material is applied, and thus, device performance may be boosted. In addition, the electronic device according to various embodiments described above may have a MOSCAP structure or a capacitor structure obtained by stacking a mixed material layer in which an orthorhombic crystal phase and a tetragonal crystal phase are mixed and thus a ferroelectric material and an anti-ferroelectric material coexist, and a dielectric layer, and when applied to a FET, may be used as a gate stack and may be applied to a 2D structure as well as a 3D structure.

Figure 18:
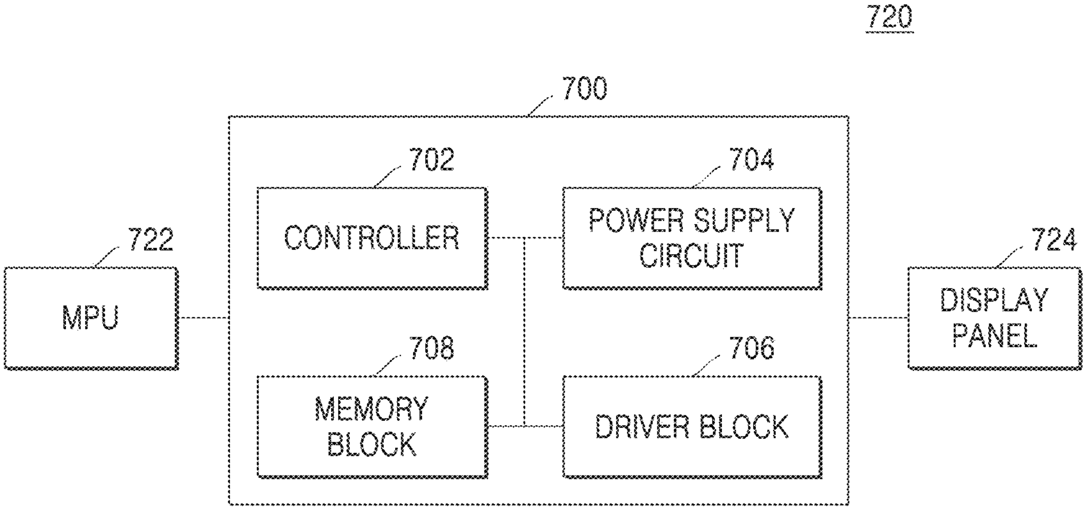
FIG. 18 is a schematic block diagram of a display driver integrated circuit (IC) and a display apparatus including the display driver IC, according to at least one embodiment.

FIG. 18 is a schematic block diagram of a display driver integrated circuit (IC) (DDI) 700 and a display apparatus 720 including the DDI 700, according to at least one embodiment.

Referring to FIG. 18, the DDI 700 may include a controller 702, a power supply circuit 704, a driver block 706, and a memory block 708. The controller 702 may be configured to receive and decode a command applied from a main processing unit (MPU) 722, and to control each block of the DDI 700 to implement an operation according to the command. The power supply circuit 704 generates a drive voltage in response to control of the controller 702. The driver block 706 drives a display panel 724 by using the drive voltage generated by the power supply circuit 704 in response to control of the controller 702. The display panel 724 may be, for example, a liquid-crystal display panel, an organic light-emitting device (OLED) display panel, a micro-light emitting device (LED) panel, or a plasma display panel. The memory block 708 may temporarily store a command input to the controller 702 or control signals output from the controller 702, or may store necessary data, and may include memory such as random-access memory (RAM) or read-only memory (ROM). For example, the memory block 708 may include electronic devices according to the above-described embodiments.

Figure 19:
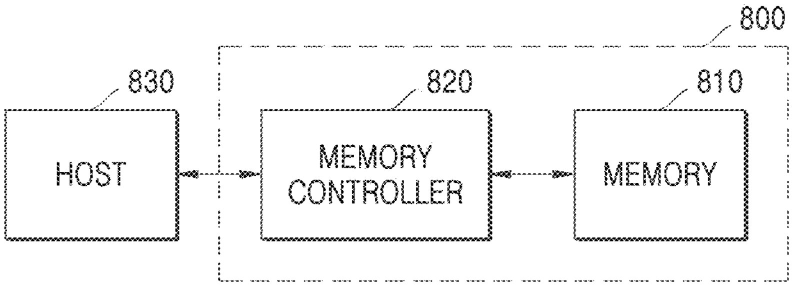
FIGS. 19 and 20 are block diagrams illustrating electronic apparatuses according to some embodiments.

FIG. 19 is a block diagram illustrating an electronic apparatus 800 according to at least one embodiment. Referring to FIG. 19, the electronic apparatus 800 includes a memory 810 and a memory controller 820. The memory controller 820 may control the memory 810 to read data from the memory 810 and/or write data to the memory 810 in response to a request from a host 830. The memory 810 may include electronic devices according to the above-described embodiments.

Figure 20:
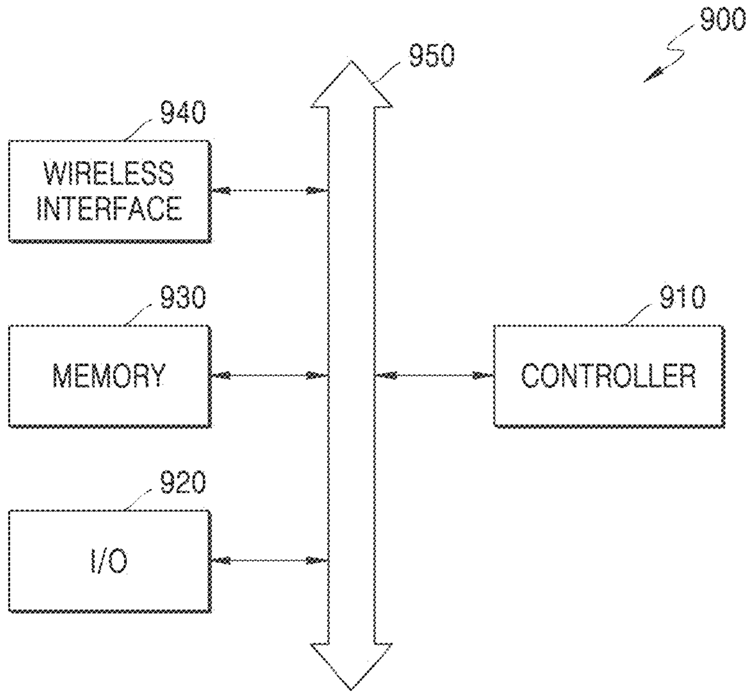

FIG. 20 is a block diagram of an electronic apparatus 900 according to at least one embodiment. Referring to FIG. 20, the electronic apparatus 900 may constitute a wireless communication device or a device configured to transmit and/or receive information in a wireless environment. The electronic apparatus 900 includes a controller 910, an input/output device (I/O) 920, a memory 930, and a wireless interface 940, which are connected to each other through a bus 950.

The controller 910 may include at least one of a microprocessor, a digital signal processor, or a processing device similar thereto. The input/output device 920 may include at least one device configured to receive inputs and/or to output data, including, e.g., at least one of a keypad, a keyboard, a display, a speaker, etc. The memory 930 may be used to store a command executed by controller 910. For example, the memory 930 may be used to store user data. The electronic apparatus 900 may use the wireless interface 940 to transmit/receive data through a wireless communication network. The wireless interface 940 may include an antenna and/or a wireless transceiver. In some embodiments, the electronic apparatus 900 may be used, for example, in a third generation communication system, for example, code-division multiple access (CDMA), global system for mobile communications (GSM), north American digital cellular (NADC), extended-time division multiple access (E-TDMA), and/or a communication interface protocol for the third generation communication system, for example, wide-band CDMA (WCDMA). The memory 930 of the electronic apparatus 900 may include an electronic device according to the above-described embodiments.

Figure 21:
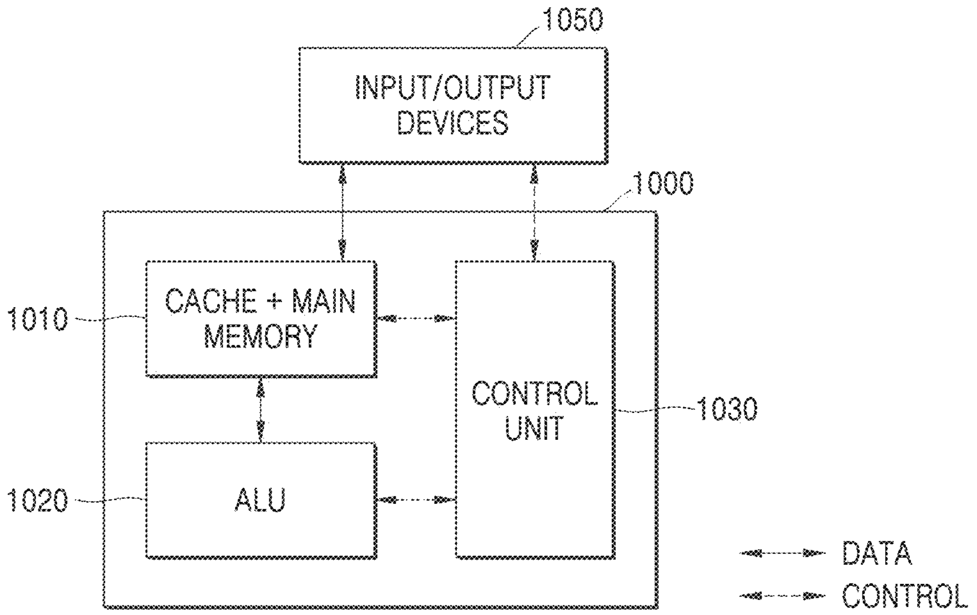
FIGS. 21 and 22 are conceptual diagrams schematically illustrating a device architecture that may be applied to an electronic apparatus, according to some embodiments.
Figure 22:
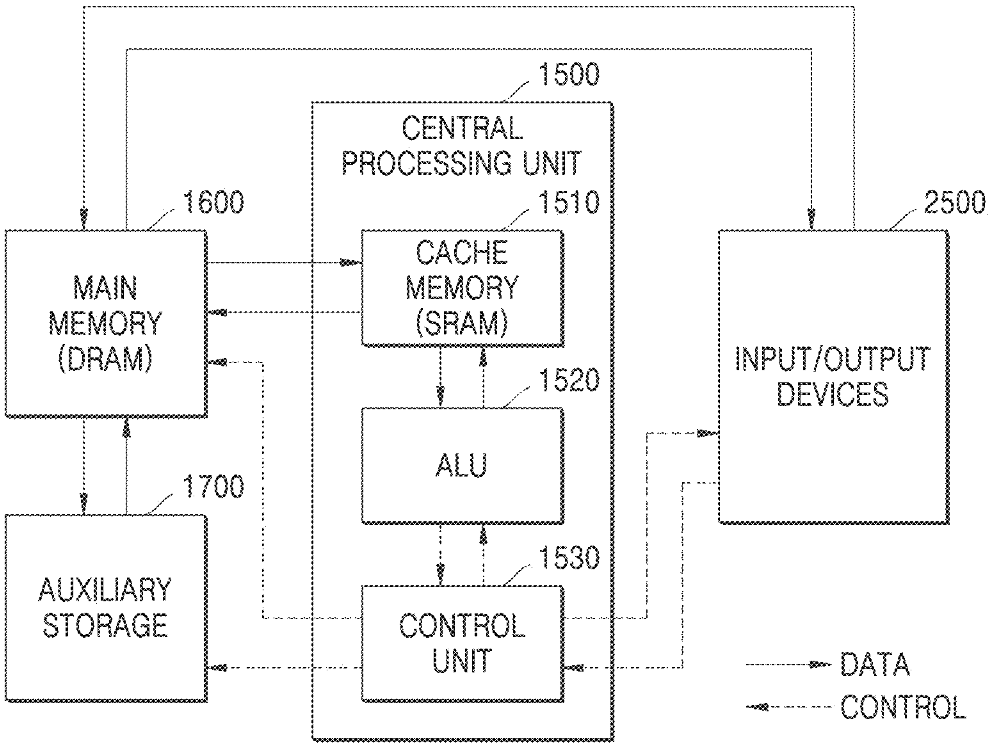

FIGS. 21 and 22 are conceptual diagrams schematically illustrating a device architecture that may be applied to an electronic apparatus, according to at least one embodiment.

Referring to FIG. 21, an electronic device architecture 1000 may include a memory unit 1010 and a control unit 1030, and may further include an arithmetic logic unit (ALU) 1020. The memory unit 1010, the ALU 1020, and the control unit 1030 may be electrically connected to each other. For example, the electronic device architecture 1000 may be implemented as one chip including the memory unit 1010, the ALU 1020, and the control unit 1030. In detail, the memory unit 1010, the ALU 1020, and the control unit 1030 may be connected to each other via metal lines in an on-chip manner, to directly communicate with each other. The memory unit 1010, the ALU 1020, and the control unit 1030 may be monolithically integrated on one substrate to constitute one chip. Input/output devices 1050 may be connected to the electronic device architecture (chip) 1000. In addition, the memory unit 1010 may include both a main memory and a cache memory. The electronic device architecture (chip) 1000 may be an on-chip memory processing unit. The memory unit 1010, the ALU 1020, and/or the control unit 1030 may independently include the electronic device according to the above-described embodiments.

Referring to FIG. 22, a cache memory 1510, an ALU 1520, and a control unit 1530 may constitute a central processing unit (CPU) 1500, and the cache memory 1510 may include static RAM (SRAM). Separately from the CPU 1500, a main memory 1600 and an auxiliary storage 1700 may be provided, and input/output devices 2500 may also be provided. The main memory 1600 may be, for example, dynamic RAM (DRAM) and may include the electronic device according to the above-described embodiments.

In some cases, the electronic device architecture may be implemented in such a manner that computing unit devices and memory unit devices are adjacent to each other in one chip without distinguishing sub-units.

Although the electronic device and the electronic apparatus including the electronic device are described above with reference to the embodiments illustrated in the drawings, the embodiments are merely exemplary, and it will be understood by one of skill in the art that various modifications and equivalent embodiments may be made therefrom. Therefore, the disclosed embodiments are to be considered in a descriptive sense only, and not for purposes of limitation. The scope of the disclosure is in the claims rather than the above descriptions, and all differences within the equivalent scope should be construed as being included in the disclosure.

According to the electronic device and the electronic apparatus including the electronic device according to the embodiments, by forming the electronic device to include a mixed material layer in which an orthorhombic crystal phase and a tetragonal crystal phase are mixed and thus a ferroelectric material and an anti-ferroelectric material coexist, a region exhibiting negative capacitance may be expanded, and accordingly, it is possible to enhance and expand performance boosting of the electronic device by a negative capacitance effect.

It should be understood that the embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:

a conductive material layer;

a mixed material layer covering the conductive material layer and comprising a mixture of an orthorhombic crystal phase and a tetragonal crystal phase such that a ferroelectric material and an anti-ferroelectric material coexist in the mixed material layer, wherein a proportion of the orthorhombic crystal phase in the mixed material layer is between about 35% and about 65%; and an electrode layer covering the mixed material layer, wherein the mixed material layer is configured to have two or three S-curves in a polarization-electric field relationship.

2. The electronic device of claim 1, wherein the mixed material layer comprises an oxide comprising $Hf_{1-x}A_xO_2$ (x≤0.5), and A comprises at least one of Al, Si, Zr, Y, La, Gd, and Sr.

3. The electronic device of claim 1, wherein the mixed material layer comprises $Hf_{1-x}Zr_xO_2$ (x≤0.5).

4. The electronic device of claim 1, wherein the mixed material layer is a single layer.

5. The electronic device of claim 1, wherein the orthorhombic crystal phase has ferroelectricity, the tetragonal crystal phase has anti-ferroelectricity, and the mixed material layer includes one to three energy barrier regions.

6. The electronic device of claim 1, wherein the mixed material layer exhibits negative capacitance within an electric field range of about −10 MV/cm to about +10 MV/cm.

7. The electronic device of claim 1, wherein the mixed material layer has a thickness of about 0.1 nm to about 20 nm.

8. The electronic device of claim 1, wherein crystallization of the mixed material layer is obtained by performing a heat treatment before forming the electrode layer or by performing heat treatments before and after the forming of the electrode layer.

9. The electronic device of claim 1, further comprising:

a dielectric layer between the mixed material layer and at least one of the conductive material layer and the electrode layer.

10. The electronic device of claim 1, wherein the electronic device comprises a transistor, the conductive material layer comprises a channel, and the electrode layer comprises a gate electrode.

11. The electronic device of claim 10, further comprising:

a substrate, wherein the channel is at least one of spaced apart from an upper surface of the substrate and extends in a first direction, or comprises a plurality of channel elements spaced apart from each other in a second direction different from the first direction.

12. The electronic device of claim 11, wherein the channel comprises the plurality of channel elements, the mixed material layer is included in a plurality of mixed material layers surrounding the plurality of channel elements, respectively, and the gate electrode protrudes from the upper surface of the substrate to surround the plurality of mixed material layers.

13. The electronic device of claim 10, further comprising:

a stack structure including a plurality of the gate electrode alternately stacked in a vertical direction with a plurality of insulating layers;

a plurality of channel holes penetrating the stack structure in the vertical direction; and a plurality of memory cell strings in the plurality of channel holes, the plurality of memory cell strings each including the mixed material layer and the conductive material layer concentrically arranged inside the plurality of channel holes, wherein the plurality of memory cell strings are two-dimensionally arranged.

14. An electronic apparatus comprising at least one electronic device, wherein the at least one electronic device comprises:

a conductive material layer;

a mixed material layer covering the conductive material layer and comprising a mixture of an orthorhombic crystal phase and a tetragonal crystal phase such that a ferroelectric material and an anti-ferroelectric material coexist in the mixed material layer, wherein a proportion of the orthorhombic crystal phase of the mixed material layer is between about 35% and about 65%; and an electrode layer covering the mixed material layer, and wherein the mixed material layer is configured to have two or three S-curves in a polarization-electric field relationship.

15. The electronic apparatus of claim 14, wherein the mixed material layer is a single layer comprising $Hf_{1-x}A_xO_2$ ($x \leq 0.5$), A comprises at least one of Al, Si, Zr, Y, La, Gd, and Sr, and the mixed material layer includes one to three energy barrier regions.

16. The electronic apparatus of claim 14, wherein the mixed material layer is a single layer containing $Hf_{1-x}Zr_xO_2$ ($x \leq 0.5$) and includes one to three energy barrier regions.

17. The electronic apparatus of claim 14, wherein the at least one electronic device comprises a transistor, the conductive material layer comprises a channel, the electrode layer comprises a gate electrode, the at least one electronic device further comprises a substrate, and the channel is at least one of spaced apart from an upper surface of the substrate and extends in a first direction, or comprises a plurality of channel elements spaced apart from each other in a second direction different from the first direction.

18. The electronic apparatus of claim 17, wherein the channel comprises the plurality of channel elements, the mixed material layer is included in a plurality of mixed material layers surrounding the plurality of channel elements, respectively, and the gate electrode protrudes from the upper surface of the substrate to surround the plurality of mixed material layers.

19. The electronic apparatus of claim 14, wherein the at least one electronic device comprises a transistor, the conductive material layer comprises a channel, the electrode layer comprises a gate electrode, and wherein the at least one electronic device further comprises a stack structure including a plurality of the gate electrode alternately stacked in a vertical direction with a plurality of insulating layers, a plurality of channel holes penetrating the stack structure in the vertical direction, and a plurality of memory cell strings in the plurality of channel holes, the plurality of memory cell strings each including the mixed material layer and the conductive material layer concentrically arranged inside the plurality of channel holes, wherein the plurality of memory cell strings are two-dimensionally arranged.

* * * * *